(12) United States Patent
Kagaya

(10) Patent No.: US 11,792,915 B2
(45) Date of Patent: Oct. 17, 2023

(54) PRINTED CIRCUIT BOARD AND OPTICAL TRANSCEIVER

(71) Applicant: CIG Photonics Japan Limited, Kanagawa (JP)

(72) Inventor: Osamu Kagaya, Tokyo (JP)

(73) Assignee: CIG PHOTONICS JAPAN LIMITED, Sagamihara (JP)

( * ) Notice: Subject to any disclaimer, the term of this patent is extended or adjusted under 35 U.S.C. 154(b) by 158 days.

(21) Appl. No.: 17/589,443

(22) Filed: Jan. 31, 2022

(65) Prior Publication Data
US 2022/0279644 A1    Sep. 1, 2022

(30) Foreign Application Priority Data

Feb. 26, 2021    (JP) .................................. 2021-030323

(51) Int. Cl.
*H05K 1/02*       (2006.01)
*H05K 1/11*       (2006.01)

(52) U.S. Cl.
CPC ........... *H05K 1/0218* (2013.01); *H05K 1/115* (2013.01); *H05K 2201/10121* (2013.01)

(58) Field of Classification Search
CPC ................. H05K 1/0218; H05K 1/115; H05K 2201/10121; H05K 1/0236; H05K 1/0245; H05K 1/0225
See application file for complete search history.

(56) References Cited

U.S. PATENT DOCUMENTS

| | | | | |
|---|---|---|---|---|
| 2008/0266019 A1* | 10/2008 | Fusayasu | ............ | H04L 25/0272 333/12 |
| 2009/0263140 A1* | 10/2009 | Kagaya | ................ | H05K 1/0253 398/139 |
| 2011/0032048 A1* | 2/2011 | Wu | ......................... | H01P 1/203 333/185 |
| 2011/0298563 A1 | 12/2011 | Pai et al. | | |
| 2012/0098627 A1 | 4/2012 | Kameya | | |
| 2012/0269522 A1 | 10/2012 | Kagaya | | |
| 2017/0099728 A1* | 4/2017 | Janssen | ..................... | H04B 3/30 |
| 2020/0045808 A1* | 2/2020 | Kagaya | ................ | H05K 1/181 |

FOREIGN PATENT DOCUMENTS

JP    2012227887 A    11/2012
WO    2011004453 A1    1/2011

* cited by examiner

*Primary Examiner* — Sherman Ng
(74) *Attorney, Agent, or Firm* — MATTINGLY & MALUR, PC

(57) ABSTRACT

A printed circuit board includes: a conductor plate below the inner dielectric layer; some vias through the inner dielectric layer, bonded to the conductor plate, centered at respective points on an upper surface of the conductor plate; a ground conductor above the inner dielectric layer, bonded to the vias, extending outwardly from any quadrangle with vertices being the nearest four points of the points; an electromagnetic resonance plate above the inner dielectric layer and inside the quadrangle, electrically connected to the ground conductor and the vias with a portion other than a protruding outer edge serving as a junction; an upper dielectric layer above the electromagnetic resonance plate; and a differential transmission line pair composed of a pair of strip conductors overlapping with the electromagnetic resonance plate, above the upper dielectric layer. The conductor plate and the vias constitute an electromagnetic field confinement structure.

24 Claims, 25 Drawing Sheets

US 11,792,915 B2

PRINTED CIRCUIT BOARD AND OPTICAL TRANSCEIVER

CROSS-REFERENCE TO RELATED APPLICATION

The present application claims priority from Japanese patent application JP2021-030323 filed on Feb. 26, 2021, the contents of which are hereby incorporated by reference into this application.

BACKGROUND

1. Field

This disclosure relates to a printed circuit board and an optical transceiver.

2. Description of the Related Art

An optical transceiver contains an integrated circuit (IC). The IC includes a differential amplifier circuit where a switching noise is generated due to nonlinearity of a transistor. Thus, a frequency spectrum of a common-mode component of an output signal exhibits a large peak at a frequency corresponding to a modulation rate (or modulation speed, symbol rate). Part of the common-mode component propagates into space as a radiation loss. For example, an optical transceiver of 100 Gbit/s uses electrical serial data signals with 25.78 Gbit/s modulation rates, generating an unwanted electromagnetic wave at a frequency of 25.78 GHz corresponding to the modulation rates. For countermeasures against the unwanted electromagnetic wave, a resonator is utilized (WO 2011/004453, JP 2012-227887A, US 2011/0298563A1).

The conventional resonator requires a relatively large area to obtain a desired resonant frequency, thereby failing to satisfy demand for high density arrangement.

SUMMARY

The disclosure aims to reduce an unwanted electromagnetic wave.

A printed circuit board includes: an inner dielectric layer; a conductor plate below the inner dielectric layer; some vias through the inner dielectric layer, the vias being bonded to the conductor plate, the vias being centered at respective points on an upper surface of the conductor plate; a ground conductor above the inner dielectric layer, the ground conductor being bonded to the vias, the ground conductor extending outwardly from any quadrangle with vertices being the nearest four points of the points; an electromagnetic resonance plate above the inner dielectric layer and inside the quadrangle, the electromagnetic resonance plate being electrically connected to the ground conductor and the vias with a portion other than a protruding outer edge serving as a junction; an upper dielectric layer above the electromagnetic resonance plate; and a differential transmission line pair composed of a pair of strip conductors overlapping with the electromagnetic resonance plate, above the upper dielectric layer. The conductor plate and the vias constitute an electromagnetic field confinement structure. The electromagnetic resonance plate is capable of resonating with an unwanted electromagnetic wave propagating through the differential transmission line pair.

The resonance of the electromagnetic resonance plate can impede the propagation of the unwanted electromagnetic wave. Further, the conductor plate and the vias constitute the electromagnetic field confinement structure, thereby sufficiently suppressing outward leakage of resonance energy.

An optical transceiver includes: the above printed circuit board; and an optical subassembly electrically connected to the printed circuit board.

DETAILED DESCRIPTION

Figure 1:
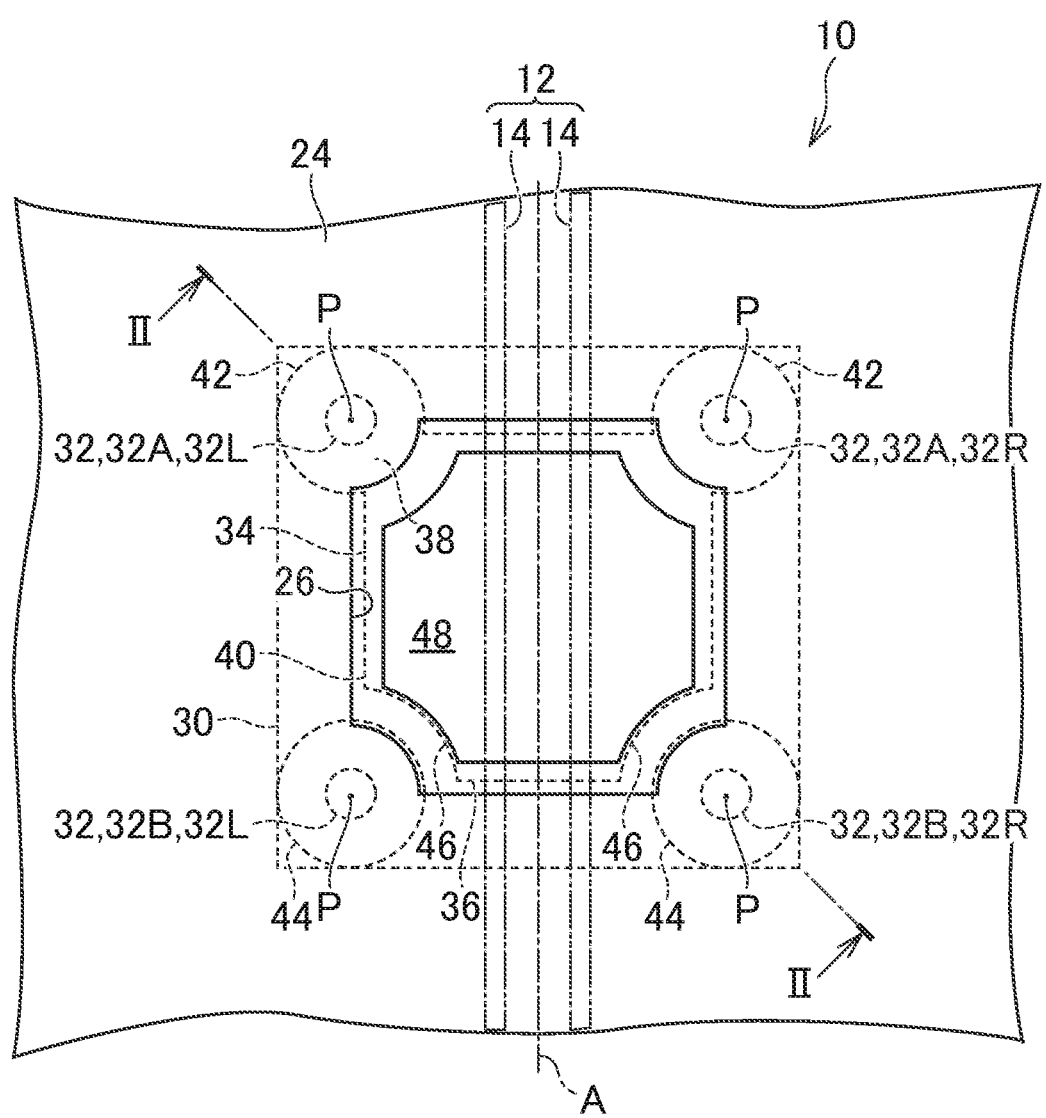
FIG. 1 is a partial plan view of a printed circuit board according to a first embodiment.

Hereinafter, some embodiments will be described specifically and in detail with reference to drawings. In all the drawings, the members with the same reference numerals have the identical or same feature and their repetitive description will be omitted. Sizes of figures do not always comply with magnification.

First Embodiment

Figure 2:
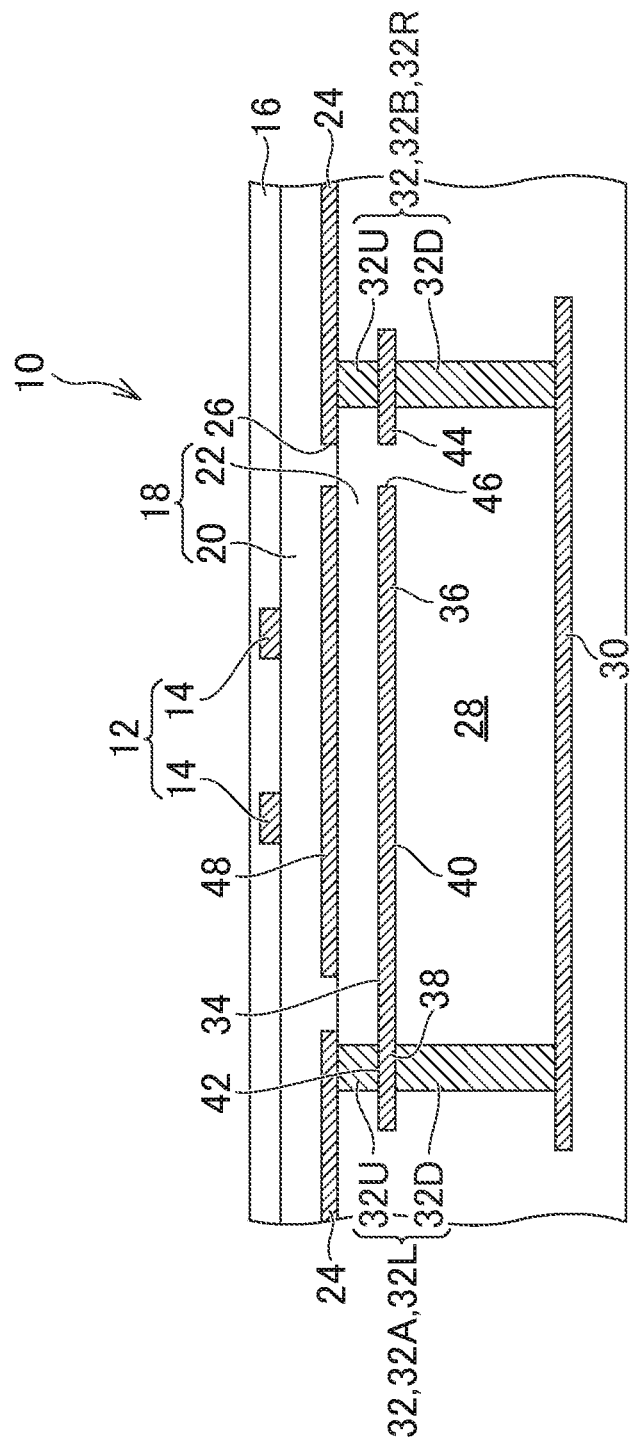
FIG. 2 is a II-II cross-sectional view of the printed circuit board in FIG. 1.

FIG. 1 is a partial plan view of a printed circuit board according to a first embodiment. FIG. 2 is a II-II cross-sectional view of the printed circuit board in FIG. 1.
[Differential Transmission Line]

The printed circuit board 10 has a differential transmission line pair 12. The differential transmission line pair 12 is a signal line for digital modulation signals, being composed of a pair of strip conductors 14.

The pair of strip conductors 14 are in a line symmetric positional relationship. The pair of strip conductors 14 have a width of 0.09 mm with a gap of 0.23 mm therebetween. The pair of strip conductors 14 have straight portions parallel to each other.

An unwanted electromagnetic wave is radiated from the differential transmission line pair 12. The unwanted electromagnetic wave has a frequency (e.g., 25.78 GHz), which corresponds to a modulation rate of the digital modulation signals transmitted through the differential transmission line pair 12.

A protective film 16 may be disposed to cover the differential transmission line pair 12. The protective film is a dielectric film for solder adhesion prevention, called a solder resist, with a thickness of about 40 μm.
[Upper Dielectric Layer]

The printed circuit board 10 has an upper dielectric layer 18. The differential transmission line pair 12 is above the upper dielectric layer 18. The upper dielectric layer 18 includes an upper layer 20 and a lower layer 22. Materials of the upper dielectric layer 18 may be a glass epoxy resin or a liquid crystal polymer (LCP) or a polytetrafluoroethylene (PTFE).
[Ground Conductor]

The printed circuit board 10 has a ground conductor 24. The ground conductor 24 is connected to a reference potential (e.g., ground). The ground conductor 24 is interposed between the upper layer 20 and the lower layer 22. That is, the upper dielectric layer 18 (upper layer 20) is interposed between the differential transmission line pair 12 and the ground conductor 24. The ground conductor 24 has a shape of covering the pair of strip conductors 14 widely from below. Thus, a microstrip line is constituted. The characteristic impedance in the differential-mode is set to 100Ω.

Figure 3:
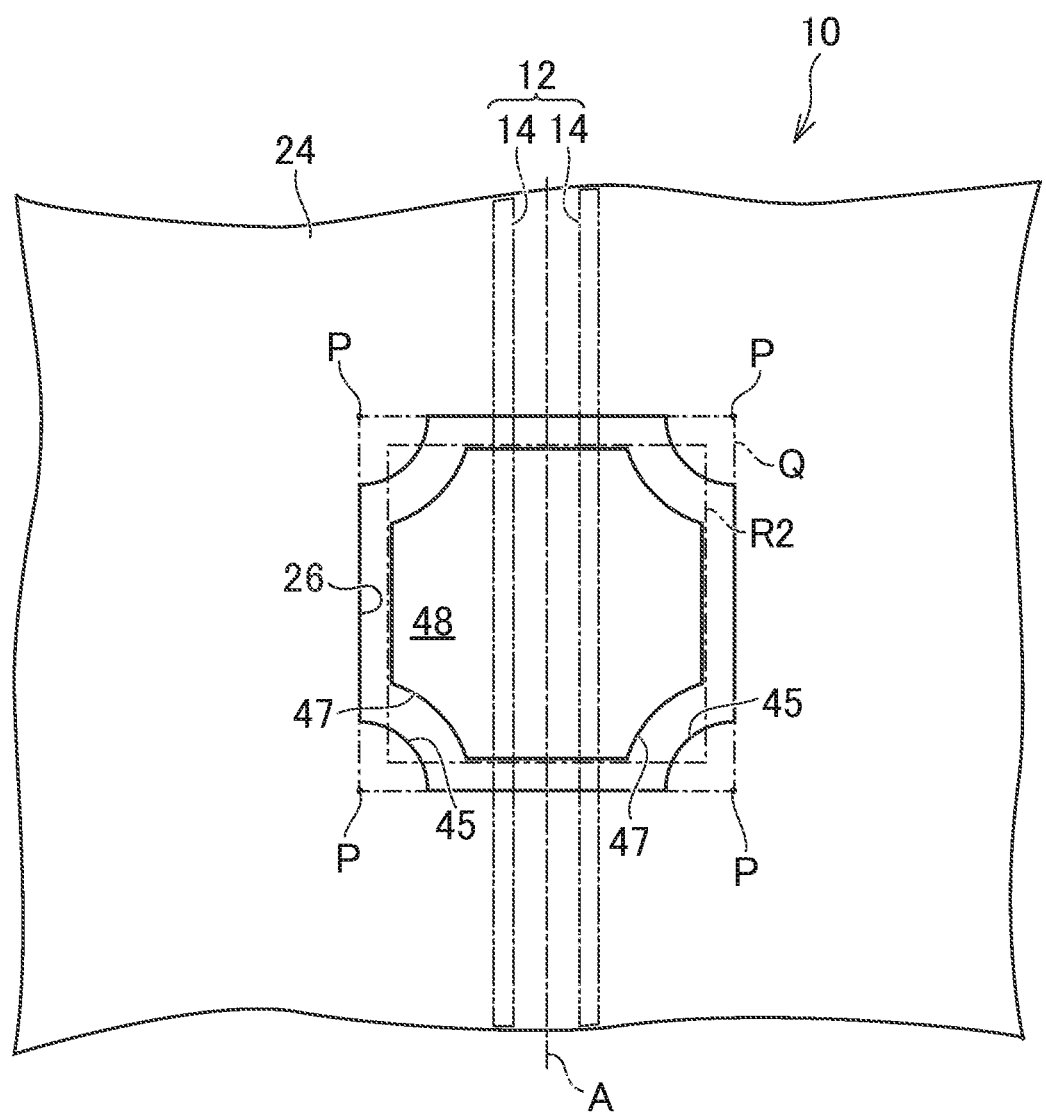
FIG. 3 is a plan view of a ground conductor and a floating conductor.

FIG. 3 is a plan view of the ground conductor 24 and a floating conductor. The ground conductor 24 extends outwardly from any quadrangle Q with vertices being the nearest four points P of some points P. The four points P have a distance therebetween of 1.3 mm in vertical length and 1.2 mm in horizontal length. The ground conductor 24 has an opening 26 inside the quadrangle Q. The opening 26 has a size of 1.3 mm in vertical length and 1.2 mm in horizontal length, and has a shape of deforming an inner corner of the quadrangle Q to be rounded inward.
[Inner Dielectric Layer]

The printed circuit board 10 has an inner dielectric layer 28 (FIG. 2). The inner dielectric layer 28 may be formed of the same materials as the upper dielectric layer 18. The ground conductor 24 is above the inner dielectric layer 28.
[Conductor Plate]

The printed circuit board 10 has a conductor plate 30. The conductor plate 30 is below the inner dielectric layer 28. The conductor plate 30 has a planar shape of 1.6 mm in vertical length and 1.5 mm in horizontal length.
[Via]

The printed circuit board 10 has some vias 32. The vias 32 are laser vias. Each vias 32 has a cylindrical shape with a diameter of 0.1 mm. Each via 32 is composed of an upper via 32U and a lower via 32D. Each via 32 (upper via 32U) is through the lower layer 22 of the upper dielectric layer 18 and bonded to the ground conductor 24.

Each via 32 (lower via 32D) is through the inner dielectric layer 28 and bonded to the conductor plate 30. The vias 32 are centered at respective points P on an upper surface of the conductor plate 30. The vias 32 includes a right pair of vias 32R and a left pair of vias 32L centered at four points P. The right pair of vias 32R and the left pair of vias 32L have a line symmetric positional relationship. The points P have a distance therebetween of 1.3 mm or 1.2 mm. That is, the vias 32 has a center-to-center distance therebetween of 1.3 mm or 1.2 mm.

The upper dielectric layer 18 and the inner dielectric layer 28 have a relative dielectric constant εr of 3.5 and a wavelength shortening ratio to vacuum ($1/\sqrt{\varepsilon r}$) of 0.535. Therefore, in the upper dielectric layer 18 and the inner dielectric layer 28, one wavelength λg of an unwanted electromagnetic wave with a frequency of 25.78 GHz is calculated to be 6.22 mm. The (maximum) center-to-center distance of the vias 32, 1.3 mm or 1.2 mm, is less than ½ (0.5λg) of the wavelength of the unwanted electromagnetic wave. The conductor plate 30 and the vias constitute an electromagnetic field confinement structure.
[Electromagnetic Resonance Plate]

The printed circuit board 10 has an electromagnetic resonance plate 34 (FIG. 2). The electromagnetic resonance plate 34 is above the inner dielectric layer 28. The electromagnetic resonance plate 34 is interposed between the lower layer 22 of the upper dielectric layer 18 and the inner dielectric layer 28. The upper dielectric layer 18 is above the electromagnetic resonance plate 34.

The electromagnetic resonance plate 34 is electrically connected to the ground conductor 24 and some of the vias 32. The electromagnetic resonance plate 34, at a portion other than a protruding outer edge 36, is a junction 38. The protruding outer edge 36 of the electromagnetic resonance plate 34 does not overlap with the ground conductor 24.

Figure 4:
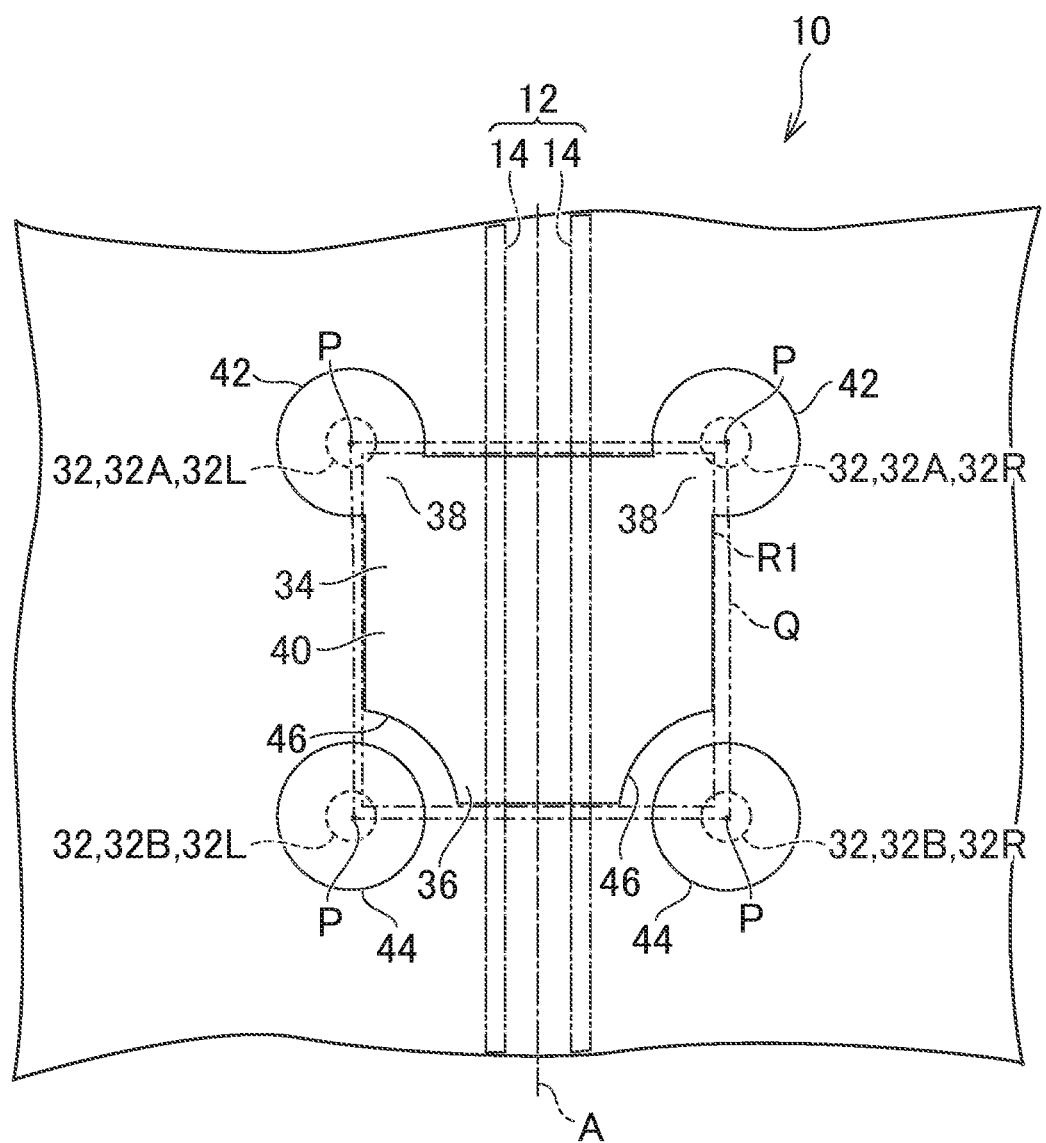
FIG. 4 is a plan view of an electromagnetic resonance plate.

FIG. 4 is a plan view of an electromagnetic resonance plate 34. The electromagnetic resonance plate 34 (protruding outer edge 36) is inside the quadrangle Q surrounding the opening 26 (FIG. 3) of the ground conductor 24. The differential transmission line pair 12 overlaps with the electromagnetic resonance plate 34. The electromagnetic resonance plate 34 is a shape of line symmetry, with respect to a symmetry axis A of the pair of strip conductors 14. The conductor plate 30 shown in FIG. 1 overlaps with the entire electromagnetic resonance plate 34.

The electromagnetic resonance plate 34 in a planar shape has a body 40 inscribed in every side of a rectangular R1 with 1.2 mm in vertical length and 1.1 mm in horizontal length, combined with a pair of land portions 42. The pair of land portions 42 are located at a pair of corners adjacent to each other along one side of the rectangle R1. There are a pair of isolated lands 44 having respective centers (points P) next to another pair of corners of the rectangle R1. The main body 40 has a planar shape with a depression 46 to exclude the pair of isolated lands 44.

The vias 32 include a first pair of vias 32A bonded to the electromagnetic resonance plate 34. The first pair of vias 32A are bonded to the respective pair of land portions 42.

The vias 32 include a second pair of vias 32B not bonded to the electromagnetic resonance plate 34. The second pair of vias 32B are bonded to the respective pair of isolated lands 44. Each land portion 42 or each isolated land 44 has a diameter, in a selected size capable of corresponding to a positional deviation of the via 32, which may be 0.3 mm.

The electromagnetic resonance plate 34 is capable of resonating with an unwanted electromagnetic wave propagating through the differential transmission line pair 12. In other words, by the resonance, the electromagnetic resonance plate 34 is designed to be able to impede propagation of the common-mode signal component. Generally, it may be designed depending on layer configurations of the printed circuit board 10 and relative dielectric constants of the dielectrics.

Furthermore, the electromagnetic field confinement structure is constituted by the vias 32 and the conductor plate 30, sufficiently suppressing outward leakage of resonance energy, improving resonance characteristics.

[Floating Conductor]

The printed circuit board 10 has a floating conductor (FIG. 3). The floating conductor 48 is interposed between the upper layer 20 and the lower layer 22 of the upper dielectric layer 18 (FIG. 2). The floating conductor 48 is in the same layer as the ground conductor 24. The floating conductor 48 is inside the opening 26 of the ground conductor 24. The floating conductor 48 is in no contact with the ground conductor 24. The opening 26 of the ground conductor 24 and the floating conductor 48 has a gap therebetween of 0.1 mm.

The floating conductor 48, on a route of a transmission path, overlaps with the differential transmission line pair 12. The floating conductor 48 has regions overlapping with the pair of strip conductors 14. The straight portion of each of the pair of strip conductors 14 is above at least the floating conductor 48. The floating conductor 48 has a shape of a line symmetry with respect to the symmetry axis A of the pair of strip conductors 14.

The floating conductor 48 has a shape of being in line contact with every side of the rectangular R2, with 1.1 mm in vertical length and 1.0 mm in horizontal length along the pair of strip conductors 14. Since the opening of the ground conductor 24 has a shape of having a projection 45 at the inner corner of the quadrangle Q, the floating conductor 48 has a depression 47 to avoid contact with the projection 45.

The floating conductor 48 is not connected to other conductors and is electrically independent. The electromagnetic resonance plate 34 overlaps with the entire floating conductor 48. The floating conductor 48 is capable of resonating with the unwanted electromagnetic wave.

[Conductor Forming Process]

To form the pair of strip conductors 14, a first layer copper foil with a thickness of 37 μm is used. To form the ground conductor 24 and the floating conductor 48, a second layer copper foil with a thickness of 32 μm is used. To form the electromagnetic resonance plate 34 and the isolated lands 44, a third layer copper foil with a thickness of 32 μm is used. To form the conductor plate 30, a fourth layer copper foil with a thickness of 32 μm is used. They are processed and formed by shaping. A distance between the first layer copper foil and the second layer copper foil is and a distance between the second layer copper foil and the third layer copper foil are set to 75 μm, and a distance between the third layer copper foil and the fourth layer copper foil is set to 300 μm.

[Characteristics]

Figure 5:
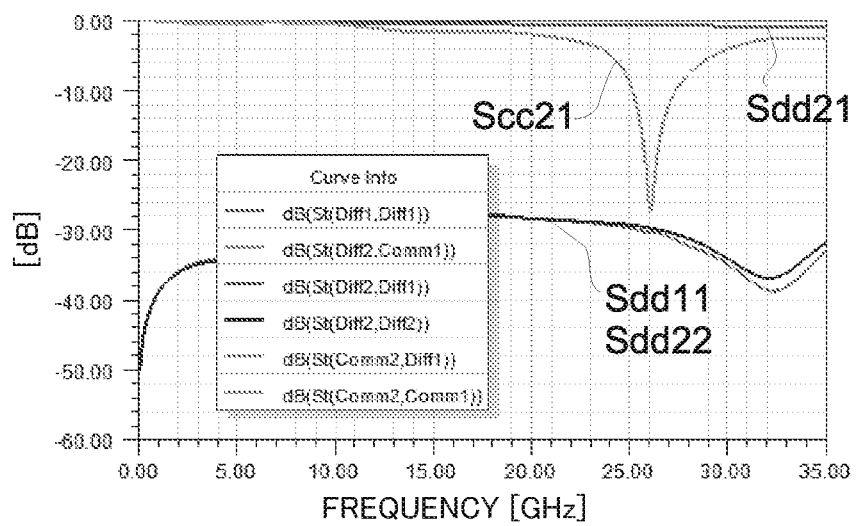
FIG. 5 is a characteristic diagram of a differential transmission line pair according to the first embodiment.

FIG. 5 is a characteristic diagram of a differential transmission line pair according to the first embodiment. Specifically, it shows a frequency dependency of a differential-mode transmission characteristic (Sdd21), differential-mode reflecting characteristics (Sdd11, Sdd22), and a common-mode transmission characteristic (Scc21) in the differential transmission line pair 12. The characteristics were calculated using a three-dimensional electromagnetic field analysis tool. In the analysis, the length of the differential transmission line pair 12 was set to 14 mm.

The differential-mode reflecting characteristics (Sdd11, Sdd22) hardly degrade, keeping very good at less than −25 dB in a frequency range of 0 to 35 GHz. This is an effect obtained from placing the floating conductor 48 in the same layer as the ground conductor 24, and forming the floating conductor 48 and the electromagnetic resonance plate 34 to have shapes of a line symmetry with respect to the symmetry axis A of the pair of strip conductors 14.

The differential-mode transmission characteristic (Sdd21) also shows a good characteristic. On the other hand, the common-mode transmission characteristic (Scc21) has an attenuating area being centered around a frequency of 26 GHz, impeding propagating of the common-mode signal component (unwanted electromagnetic wave) of a frequency 25.78 GHz by 20 dB or more. This attenuating characteristic is an effect obtained from the electromagnetic field confinement structure and the resonance by the electromagnetic resonance plate 34.

According to this embodiment, without degrading the propagation of the differential signal component, it is possible to selectively impede only the propagation of the common-mode signal component to the differential transmission line pair 12, enabling high density arrangement. Besides, there is no additional step to manufacturing processes, whereby there is no increase in cost. That is, it is possible to achieve reduction of both the unwanted electromagnetic wave and the cost.

[Modification]

Figure 6:
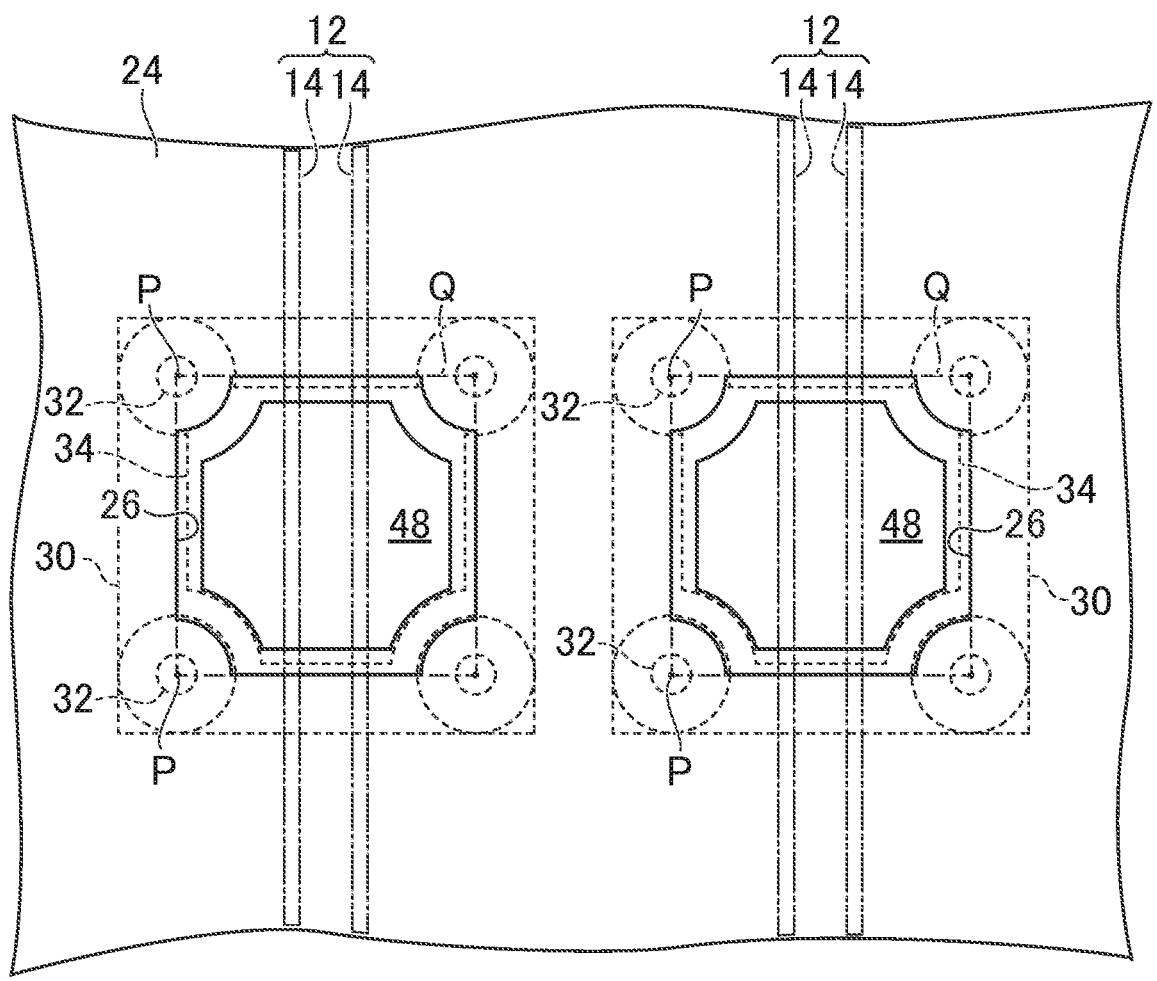
FIG. 6 is a partial plan view of the printed circuit board according to a modification of the first embodiment.

FIG. 6 is a partial plan view of the printed circuit board according to a modification of the first embodiment. The conductor plates 30 overlap with the respective electromagnetic resonance plates 34. Each of the differential transmission line pairs 12 overlaps with a corresponding one of the electromagnetic resonance plates 34. A lane pitch of two differential transmission line pairs 12 is 1.8 mm. A center-to-center distance of the nearest vias 32 of the adjacent conductor plates 30 is as close as 0.6 mm.

The ground conductor 24 has the openings 26. The openings 26 overlaps with the respective quadrangles Q. The points P at centers of the vias 32 are vertices of the quadrangles Q. The floating conductors 48 are inside the respective quadrangles Q.

Figure 7:
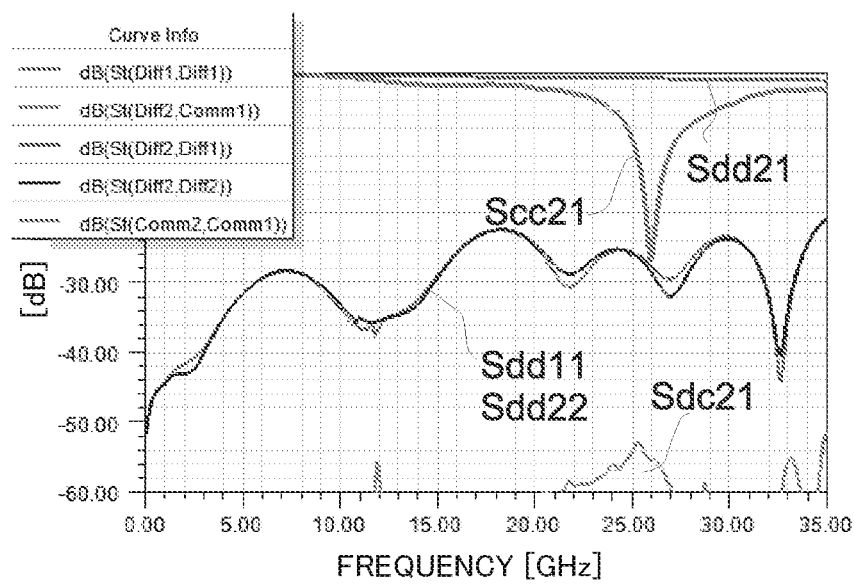
FIG. 7 is a characteristic diagram of a differential transmission line pair according to the modification of the first embodiment.

FIG. 7 is a characteristic diagram of a differential transmission line pair according to the modification of the first embodiment. The common-mode transmission characteristic (Scc21) shows an attenuating area being centered around a frequency of 26 GHz, impeding propagation of the common-mode signal component (unwanted electromagnetic wave) of a frequency 25.78 GHz by 20 dB or more.

FIG. 7 shows characteristics almost the same as the characteristics in the first embodiment (FIG. 5), maintaining good resonance characteristics. This is due to an effect obtained from sufficiently suppressing outward leakage of resonant energy by the electromagnetic field confinement structure.

Thus, even if the differential transmission line pairs 12 are closely arranged, no deterioration of crosstalk characteristics between the differential transmission line pairs 12 occurs, making it possible to selectively impede only the propagation of the common-mode signal component to the differential transmission line pairs 12.

[Optical Transceiver]

Figure 8:
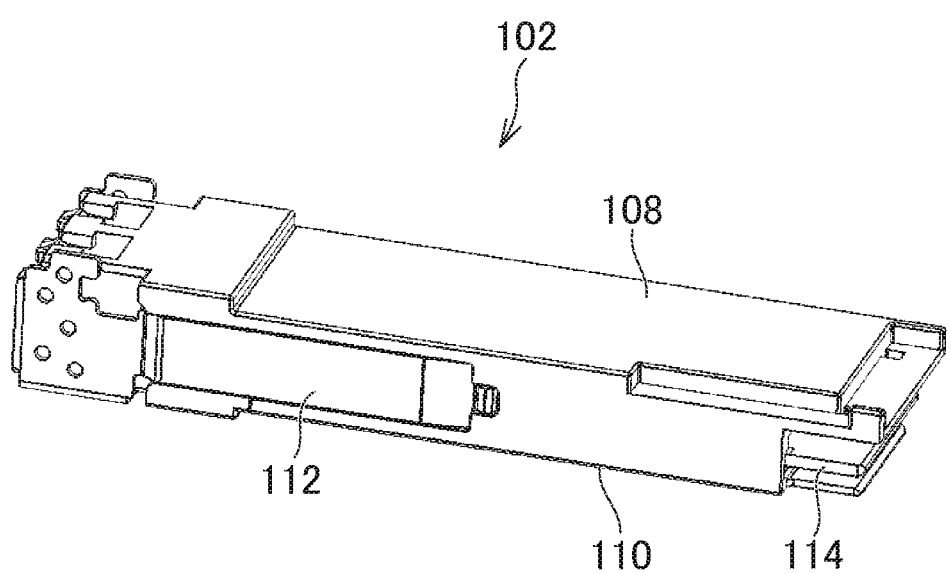
FIG. 8 is a perspective view of an optical transceiver.
Figure 9:
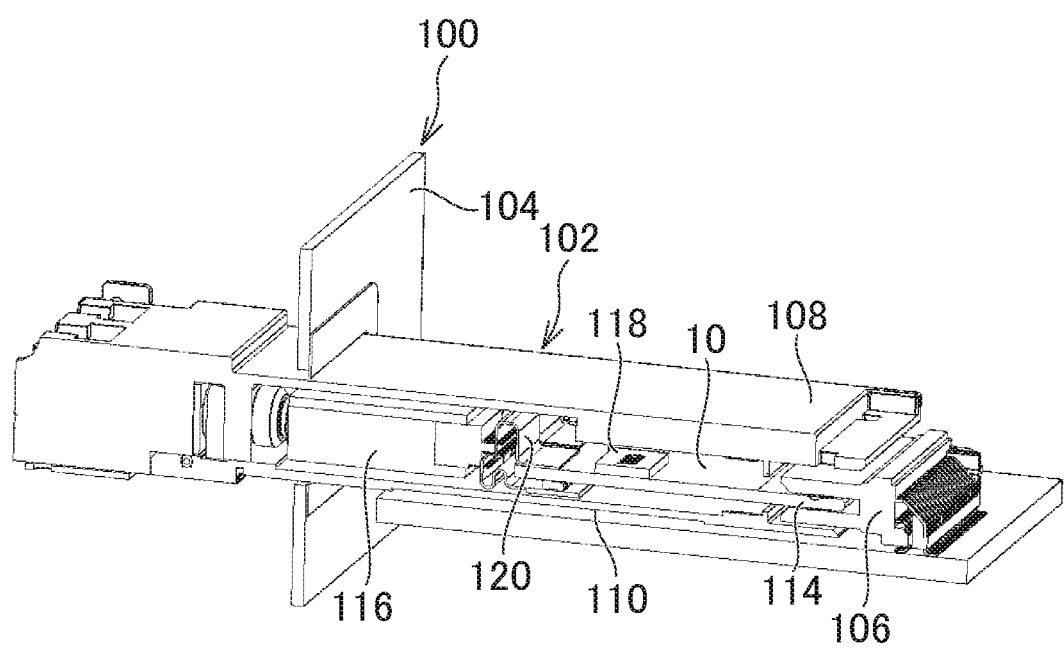
FIG. 9 is a cross-sectional view of a network device and an optical transceiver constituting part thereof.

FIG. 8 is a perspective view of an optical transceiver. FIG. 9 is a cross-sectional view of a network device and an optical transceiver constituting part thereof. A network device 100 includes a front panel 104, an optical transceiver 102, and a connector 106.

The optical transceiver 102 conforms to QSFP28 MSA standard. The optical transceiver 102 includes an upper case 108, a lower case 110, a latch 112, and a card edge connector 114. A metal such as zinc or aluminum is used for materials of the upper case 108 and the lower case 110. The upper case 108 and the lower case 110, apart from a slot opening for passing the card edge connector 114, constitute an electromagnetic shield closely together with no gap.

The card edge connector 114 is provided at an end of the printed circuit board 10, with contact terminal rows for connection with the connector 106. The card edge connector 114 is externally exposed from the slot opening at a rear of the upper case 108 and the lower case 110, for hot swapping.

The optical transceiver 102 has an optical subassembly 116 electrically connected to the printed circuit board 10. The optical subassembly 116 is a receiver optical subassembly (ROSA), while an unillustrated transmitter optical subassembly (TOSA) is also an optical subassembly. The optical transceiver 102 includes the printed circuit board 10. The optical subassembly 116 and the printed circuit board 10 are connected with a flexible printed circuit board (FPC) 120.

Some integrated circuit chips are mounted on the printed circuit board 10. The integrated circuit chip 118 shown in FIG. 9 has a clock data recovery function on a receiving side, to output differential digital modulated signals in four channels at a modulation-rate of 25.78 Gbit/s. The modulation method is NRZ (non-return-to-zero). The output signals propagate on the printed circuit board inside the network device 100 through four differential transmission line pairs 12 (FIG. 1) on the printed circuit board 10, the card edge connector 114, and the connector 106.

When an output spectrum of the integrated circuit chip 118 is measured, an unwanted clock noise component is observed as a single peak at a frequency of 25.78 GHz corresponding to the modulation rate. The structure of the first embodiment is applied to each of the four differential transmission line pairs 12, thereby impeding the propagation of the common-mode signal component at the frequency of 25.78 GHz, in the upper case 108 and the lower case 110 of the optical transceiver 102. This can suppress unwanted radiation due to the common-mode signal component in the card edge connector 114, the connector 106, and the printed circuit board 10 where no electromagnetic shield is made by the upper case 108 and the lower case 110. This mechanism enables the optical transceiver 102 for 100-Gbit/s-class to suppress the unwanted inward radiation to the network device 100 and the unwanted outward radiation from the network device 100 possibly through a ventilation hole for cooling/blowing in the network device 100.

Incidentally, the integrated circuit chip 118 can be mounted inside the optical subassembly 116, whereby no mounting space is necessary on the printed circuit board 10, leading to a wider space between the differential transmission line pairs 12 and higher flexibility of arrangement.

The optical transceiver 102 may be for 400-Gbit/s-class conforming to QSFP56-DD MSA standard. In that case, a digital signal processor (DSP) is used as the integrated circuit chip 118, outputting differential digital modulated signals of 8 channels at a modulation-rate of 26.56 Gbaud for optical reception. A PAM4 (4-valued pulse-amplitude modulation) is used for its modulation system.

The structure of the first embodiment is applied to each of eight differential transmission line pairs 12. When the output signals of the DSP are observed, a single peak of a switching noise component is observed at a frequency of 26.56 GHz corresponding to the modulation rate. By arranging the structure of the first embodiment in each of the eight differential transmission line pairs 12, the propagation of the common-mode signal component with the frequency of 26.56 GHz can be impeded in the upper case 108 and the lower case 110 of the optical transceiver 102. This can suppress the unwanted radiation due to the common-mode signal component in the card edge connector 114, the connector 106, and the printed circuit board 10, which have no electromagnetic shield. This mechanism can reduce the unwanted inward radiation to the network device 100 and the unwanted outward radiation from the network device 100 possibly through the ventilation hole for cooling/blowing in the network device 100, even if the optical transceiver 102 is for 400-Gbit/s-class.

The structure for impeding the propagation of the common-mode signal component is not limited to the first embodiment, and other embodiments described below may be applied thereto.

Second Embodiment

Figure 10:
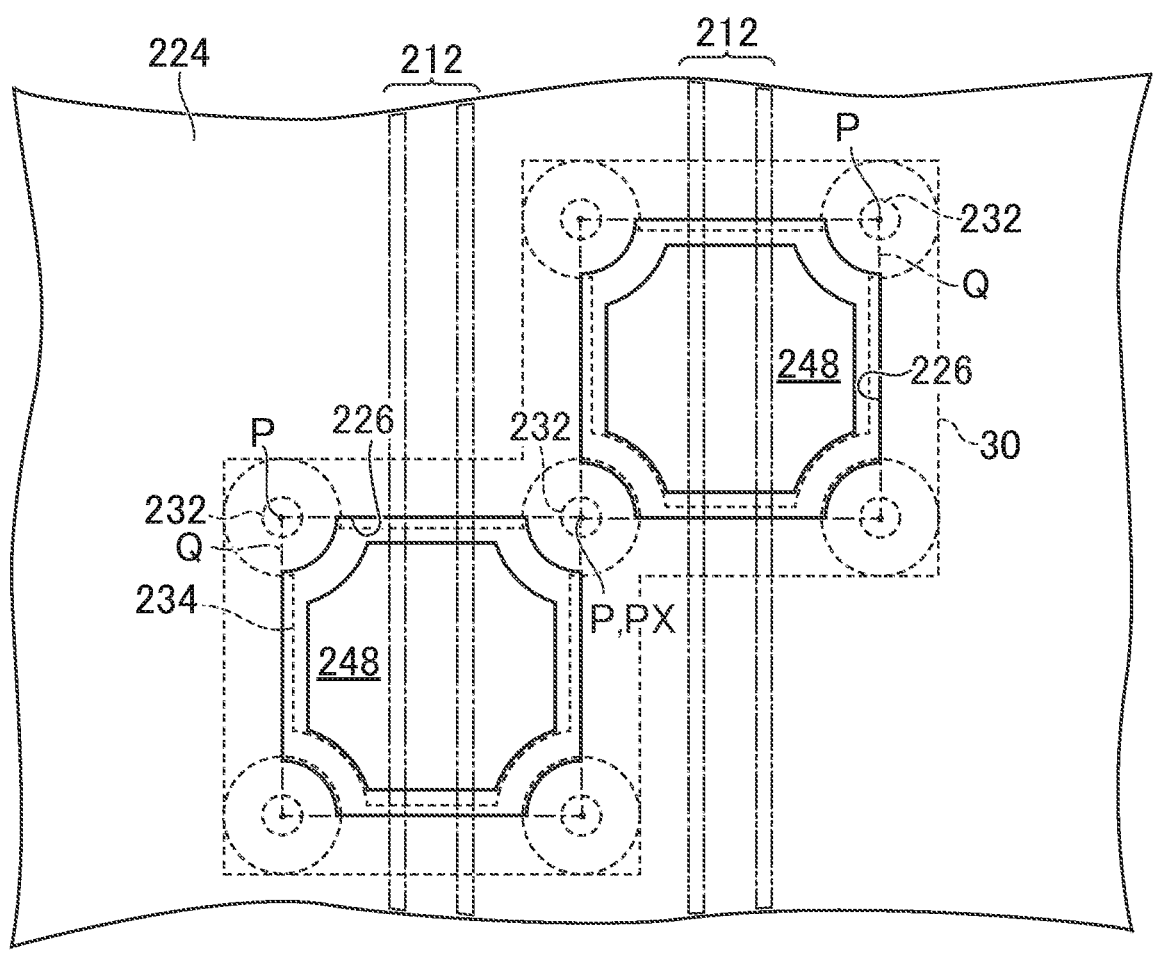
FIG. 10 is a partial plan view of a printed circuit board according to a second embodiment.

FIG. 10 is a partial plan view of a printed circuit board according to a second embodiment. Two adjacent differential transmission line pairs 212 have a lane pitch of 1.2 mm. The contents described in the first embodiment can be applied to other dimensions.

The points P at which the respective vias 232 are centered are the vertices of the quadrangles Q. The ground conductor 224 includes the openings 226 overlapping with the respective quadrangles Q. The floating conductors 248 are inside the quadrangles Q.

The adjacent ones of the rectangles Q share one point PX of the four points P that are the vertices. The via 232 at the one point PX to be shared is bonded to the adjacent electromagnetic resonance plates 234. Each of the differential transmission line pairs 212 overlaps with a corresponding one of the electromagnetic resonance plates 234. The electromagnetic resonance plates 234 are inside the respective quadrangles Q.

Figure 11:
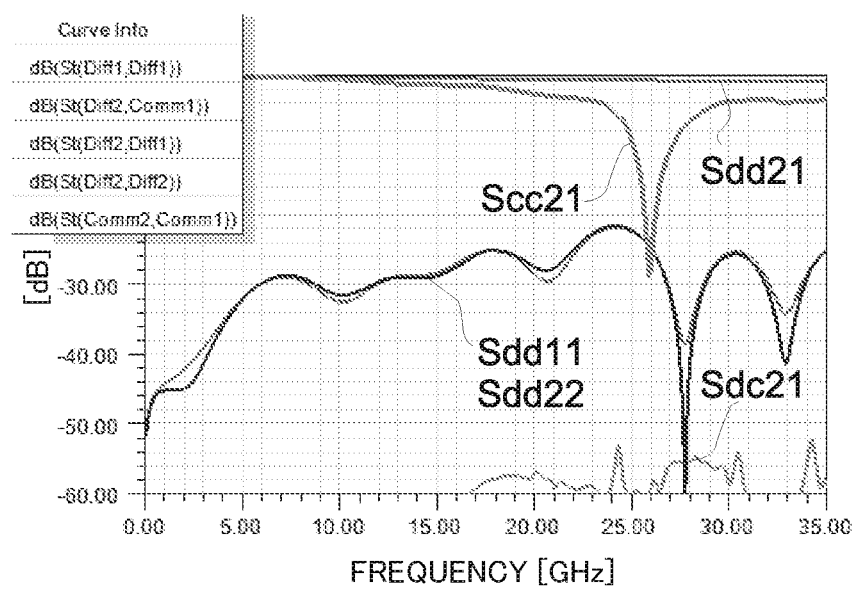
FIG. 11 is a characteristic diagram of a differential transmission line pair according to the second embodiment.

FIG. 11 is a characteristic diagram of a differential transmission line pair according to the second embodiment. Specifically, it shows the differential-mode transmission characteristic (Sdd21) in the differential transmission line pair 212, the differential-mode reflecting characteristics (Sdd11, Sdd22), and the frequency dependency of the common-mode transmission characteristic (Scc21).

The common-mode transmission characteristic (Scc21) has an attenuation area centered at a frequency of 26 GHz, thereby impeding propagation of the common-mode signal component with a frequency of 25.78 GHz by 20 dB or more.

The characteristics shown in FIG. 11 are almost the same as the characteristics shown in FIG. 5, presenting good resonance characteristics. This is due to the effect that the outward leakage of the resonant energy is sufficiently suppressed by the electromagnetic field confinement structure.

Figure 12:
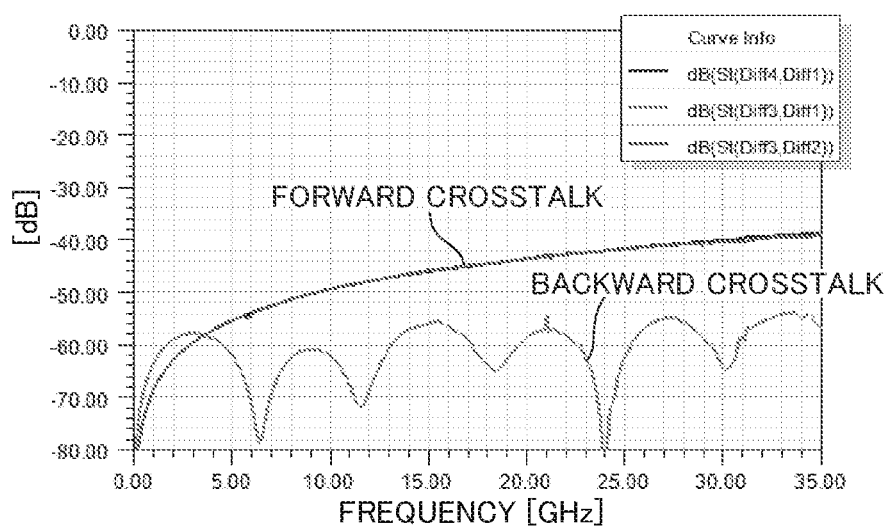
FIG. 12 is another characteristic diagram of the differential transmission line pair of the second embodiment.

FIG. 12 is another characteristic diagram of the differential transmission line pair of the second embodiment. Specifically, the frequency dependency of forward crosstalk characteristic and backward crosstalk characteristic in the differential-mode is shown.

In the present embodiment, in spite of the differential transmission line pairs 212 and the electromagnetic resonance plates 234 being close to each other, as shown in FIG. 12, the forward crosstalk characteristic is not deteriorated, and a very favorable value of −40 dB or less is shown in the frequency range of 0 to 25.78 GHz.

According to the present embodiment, some differential transmission line pairs 212 can be closely arranged, and some electromagnetic field confinement structures can be disposed with minimum dimensions in a direction along the differential transmission line pair 212 extends. Further, without degrading the crosstalk characteristic between the differential transmission line pairs 212, it is possible to selectively impede only the propagation of the common-mode signal component.

[Modification of the Second Embodiment]

Figure 13:
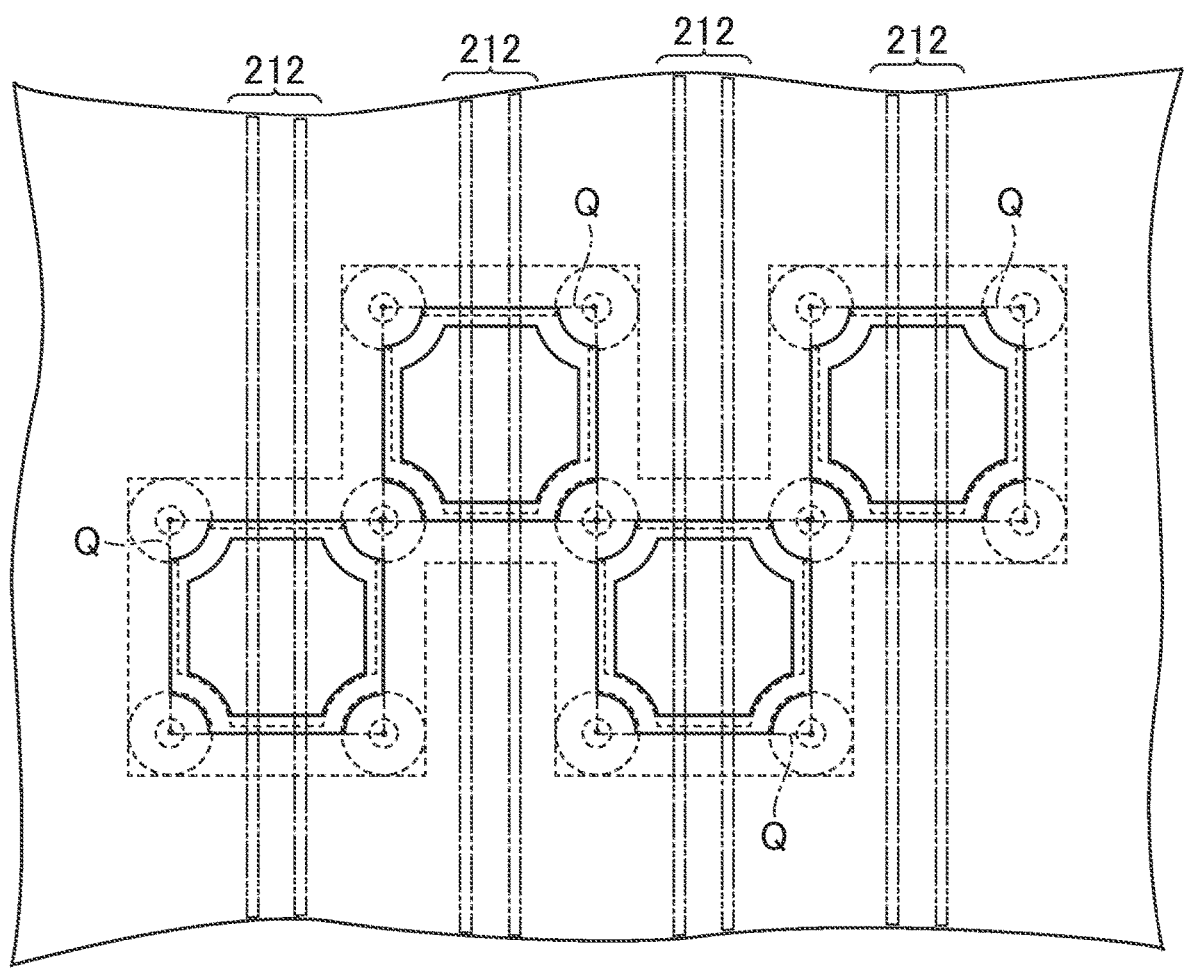
FIG. 13 is a partial plan view of a printed circuit board according to a modification of the second embodiment.

FIG. 13 is a partial plan view of a printed circuit board according to a modification of the second embodiment. The quadrangles Q are arranged in a staggered pattern. Or, some electromagnetic field confinement structures are arranged in a staggered pattern. Placing four field confinement structures requires a width of 5.1 mm. Other details are as described in the second embodiment.

An optical transceiver conforming to QSFP28 requires a small printed circuit board substrate with a width of about 16 mm, on which four differential transmission line pairs 212 are arranged for transmission, and other four differential transmission line pairs 212 are arranged for reception. Placing the four field confinement structures requires a width of 5.1 mm, which is small enough to be less than half 16 mm, meeting the requirements, being preferable. In particular, it is preferable for the optical transceiver conforming to QSFP28 because of a small mounting area.

Third Embodiment

Figure 14:
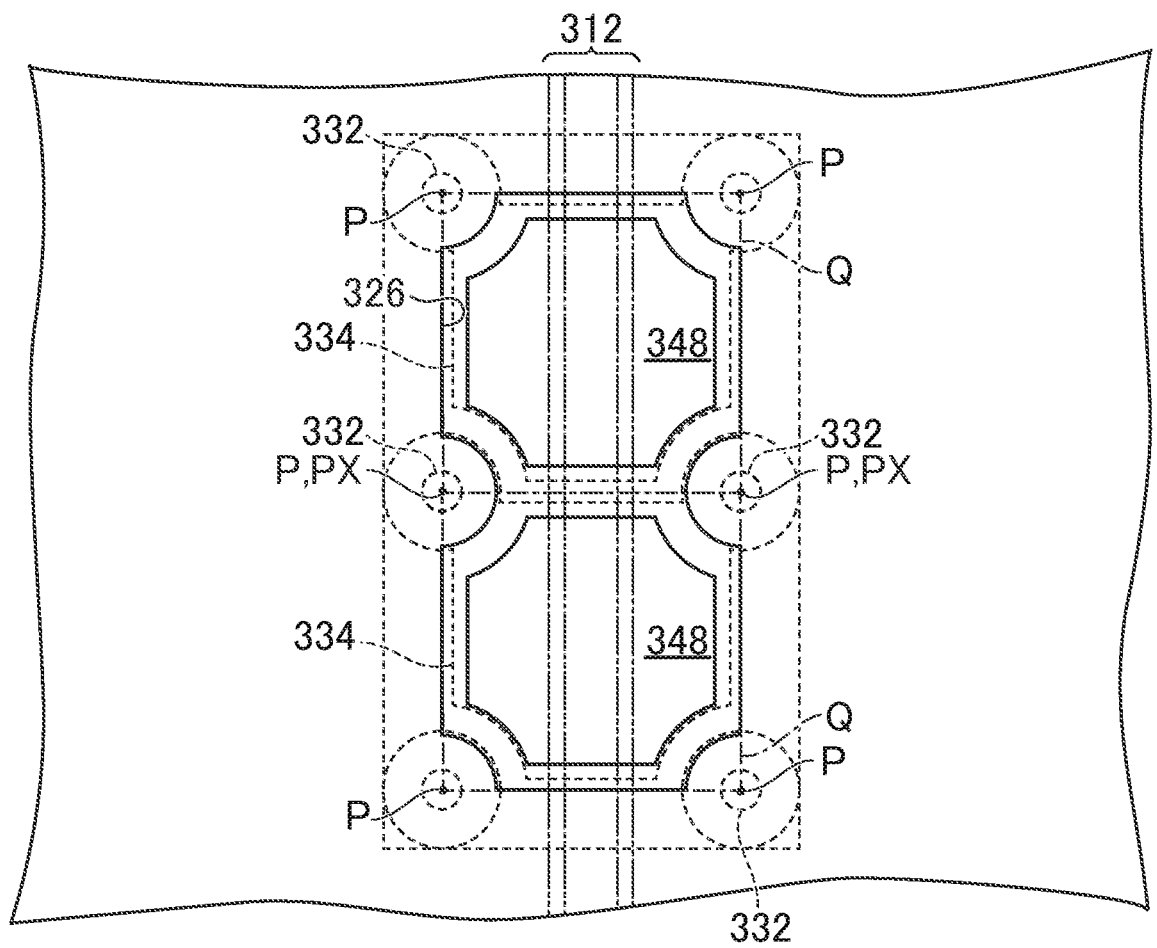
FIG. 14 is a partial plan view of a printed circuit board according to a third embodiment.

FIG. 14 is a partial plan view of a printed circuit board according to a third embodiment. The points P are vertices of the quadrangles Q. The adjacent quadrangles Q share a pair of points PX of four points P serving as the vertices. The vias 332 include a pair of vias 332 centered at the pair of points PX. One opening 326 continuously overlaps with the quadrangles Q.

Some floating conductors 348 are located inside the respective quadrangles Q. Some electromagnetic resonance plates 334 overlap with the respective quadrangles Q. The differential transmission line pair 312 overlaps with the electromagnetic resonance plates 334. The differential transmission line pair 312 is located between a pair of vias 332 centered at a pair of points PX.

In the present embodiment, a pair of electromagnetic resonance plates 334 are closely disposed in a direction along which the differential transmission line pair 312 extends. The pair of electromagnetic resonance plates 334 are apart from each other by 1.3 mm in a direction along which the transmission line extends. Six vias 332 surround the pair of electromagnetic resonance plates 334.

In FIG. 14, the upper two vias 332 are bonded to one of the electromagnetic resonance plates 334, the middle two vias 332 are bonded to another one of the electromagnetic resonance plates 334, and the lower two vias 332 are bonded to none of the electromagnetic resonance plates 334.

Figure 15:
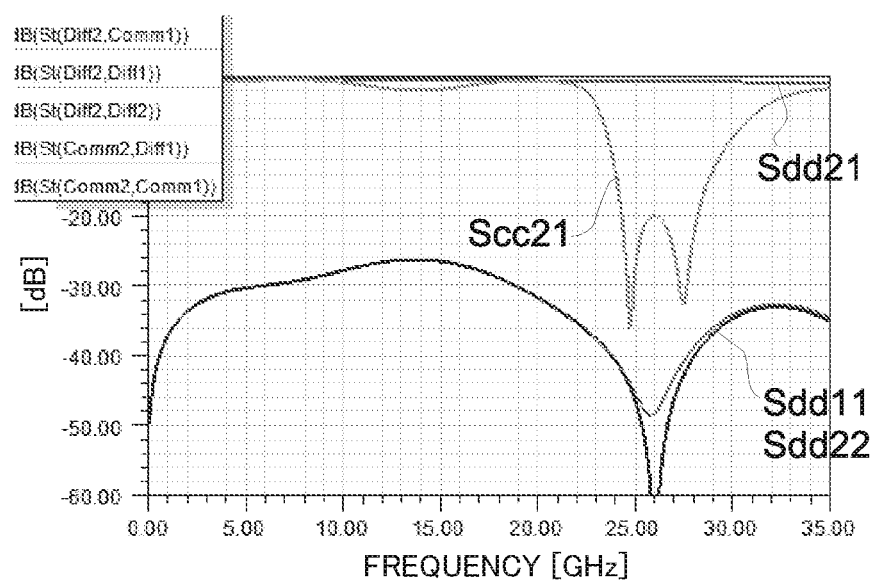
FIG. 15 is a characteristic diagram of a differential transmission line pair according to the third embodiment.

FIG. 15 is a characteristic diagram of a differential transmission line pair according to the third embodiment. Specifically, it shows a differential-mode transmission characteristic (Sdd21) in the differential transmission line pair 312, differential-mode reflecting characteristics (Sdd11, Sdd22), and frequency dependency of the common-mode transmission characteristic (Scc21) are shown.

The two electromagnetic resonance plates 334 are close enough to interact with each other, and some troughs (attenuation area) in the common-mode transmission characteristic (Scc21) may occur, but it is possible to impede the propagation of the common-mode signal component with frequency of 25.78 GHz by 20 dB or more. Furthermore, the propagation of the common-mode signal component can be impeded by 10 dB or more within a frequency range of 6 GHz from 24 GHz to 30 GHz, achieving an attenuation effect over a wide band.

Fourth Embodiment

Figure 16:
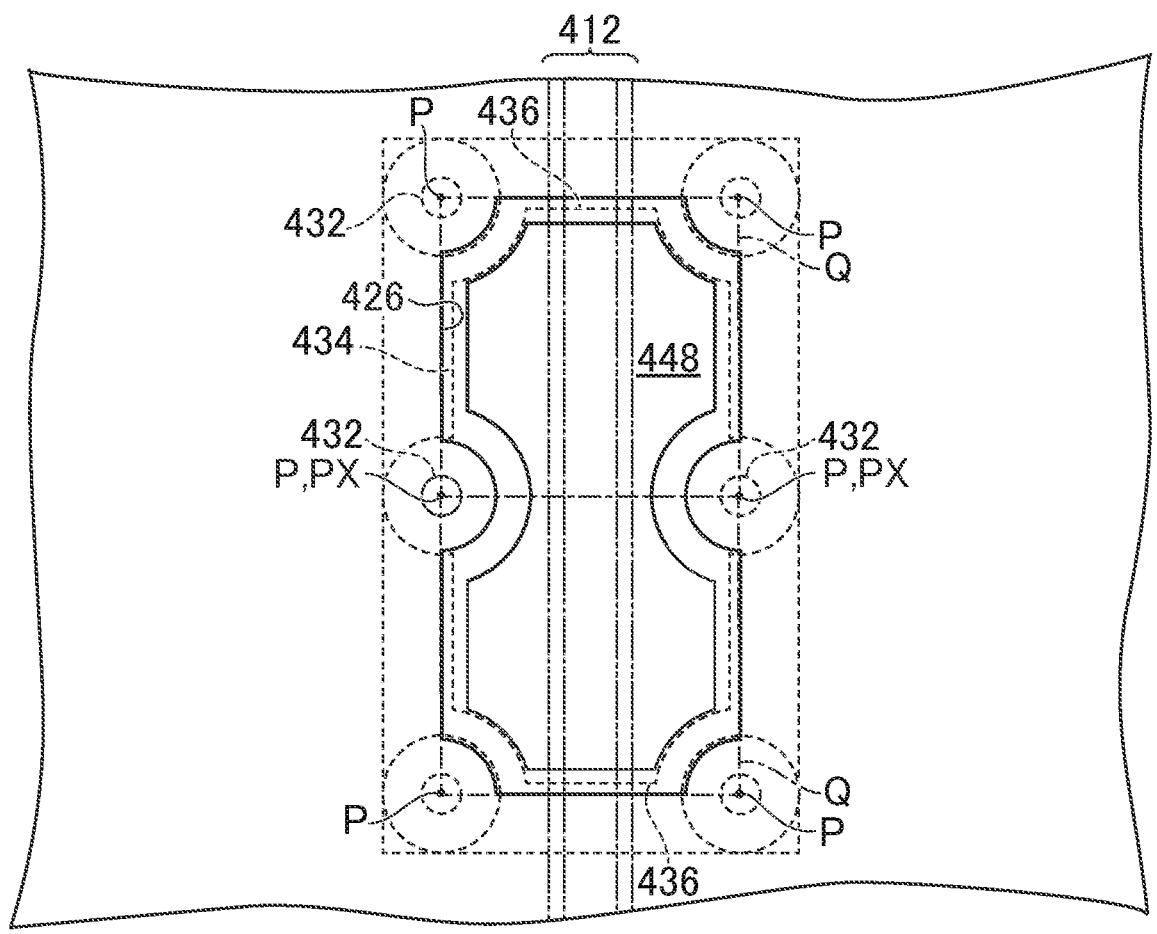
FIG. 16 is a partial plan view of a printed circuit board according to a fourth embodiment.

FIG. 16 is a partial plan view of a printed circuit board according to a fourth embodiment. The points P are vertices of the quadrangles Q. The adjacent quadrangles Q share a pair of points PX of the four points P as vertices (or a side of the quadrangle Q). The vias 432 include a pair of vias 432 centered at a pair of points PX. One opening 426 continuously overlaps with the quadrangles Q. One floating conductor 448 is located continuously inside the quadrangles Q.

Six vias 432 surround the electromagnetic resonance plate 434. In FIG. 16, the upper two vias 432 are not bonded to the electromagnetic resonance plate 434, the middle two vias 432 are bonded to the electromagnetic resonance plate 434, and the lower two vias 432 are not bonded to the electromagnetic resonance plate 434. The electromagnetic resonance plate 434 is bonded to a pair of vias 432 centered at a pair of points PX. The protruding outer edges 436 of the electromagnetic resonance plate 434 protrude in opposite directions from the pair of vias 432. The differential transmission line pair 412 is located between the pair of vias 432 centered at the pair of points PX.

Figure 17:
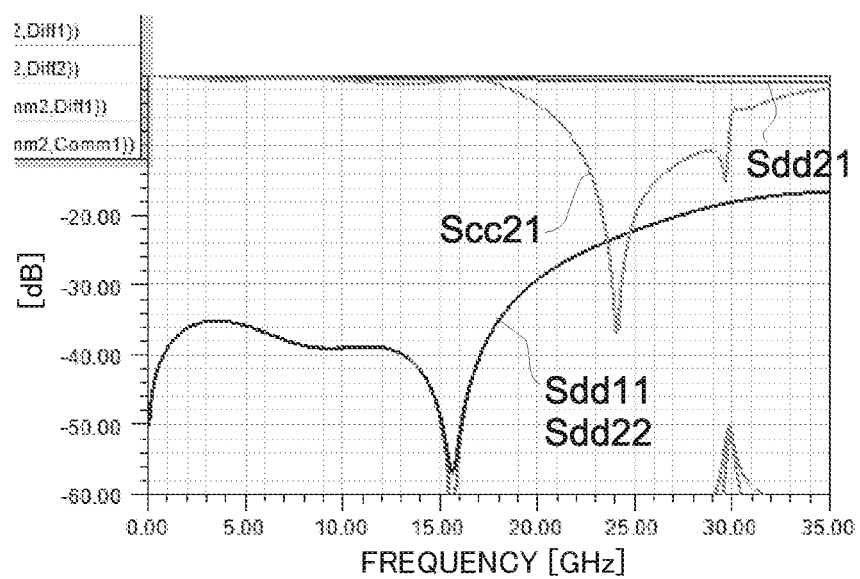
FIG. 17 is a characteristic diagram of a differential transmission line pair according to the fourth embodiment.

FIG. 17 is a characteristic diagram of a differential transmission line pair according to the fourth embodiment. Specifically, it shows a differential-mode transmission characteristic (Sdd21) in the differential transmission line pair 412, differential-mode reflecting characteristics (Sdd11, Sdd22), and frequency dependency of the common-mode transmission characteristic (Scc21).

The protruding outer edges 436 of the electromagnetic resonance plate 434 protrude in opposite directions. Interaction of them may create some troughs (attenuation area) in the common-mode transmission characteristic (Scc21), but it is possible to impede the propagation of the common-mode signal component with frequency of 24 GHz by 30 dB or more. Furthermore, the propagation of the common-mode signal component can be impeded by 10 dB or more within a frequency range of 7 GHz from 22 GHz to 29 GHz, achieving an attenuation effect over a wide band.

Fifth Embodiment

Figure 18:
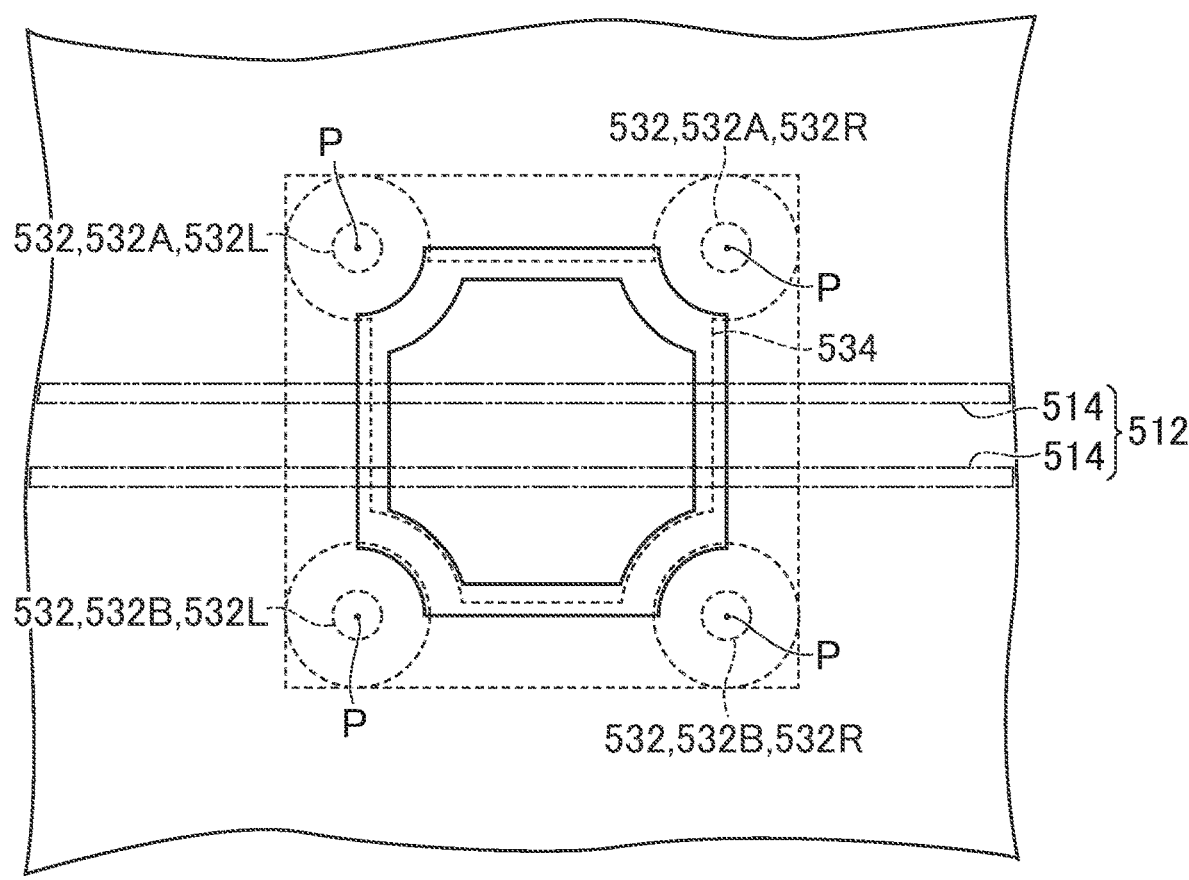
FIG. 18 is a partial plan view of a printed circuit board according to a fifth embodiment.

FIG. 18 is a partial plan view of a printed circuit board according to a fifth embodiment. This embodiment is different from the structure shown in FIG. 1, in the direction along which the differential transmission line pair 512 extends or in the position of the pair of vias 532 to which the electromagnetic resonance plate 534 is bonded. The electromagnetic resonance plate 534 has an asymmetrical shape with respect to the pair of strip conductors 514.

The vias 532 include a first pair of vias 532A bonded to the electromagnetic resonance plate 534. The vias 532 include a second pair of vias 532B not bonded to the electromagnetic resonance plate 534. In the first embodiment (FIG. 1), the differential transmission line pair 12 is between the first pair of vias 32A and between the second pair of vias 32B. By contrast, in the fifth embodiment (FIG. 18), the differential transmission line pair 512 is between the first pair of vias 532A and the second pair of vias 532B.

The four vias 532 include a right pair of vias 532R and a left pair of vias 532L, centered at the respective four points P. In the first embodiment (FIG. 1), the differential transmission line pair 12 is between the right pair of vias 32R and the left pair of vias 32L. By contrast, in the fifth embodiment shown in FIG. 18, the differential transmission line pair 512 is between the right pair of vias 532R and between the left pair of vias 532L.

Figure 19:
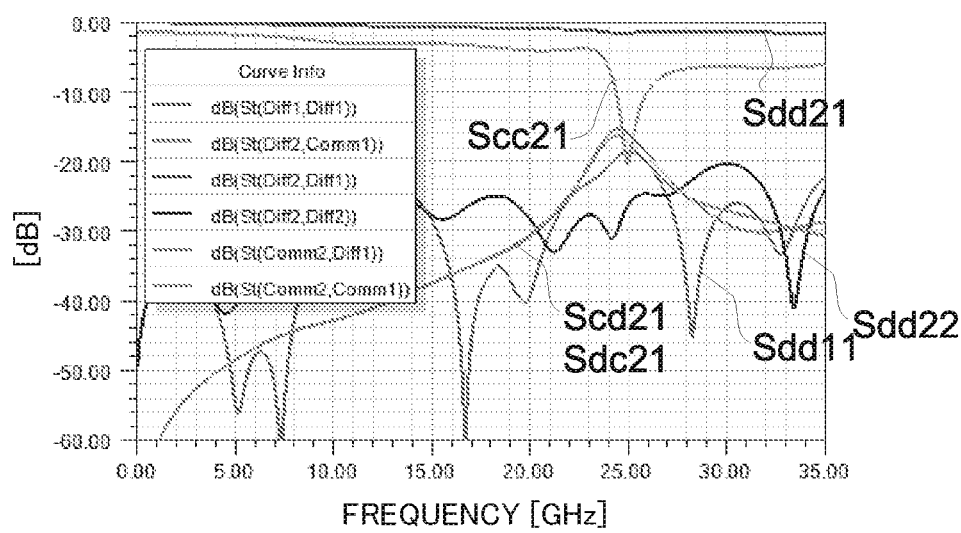
FIG. 19 is a characteristic diagram of a differential transmission line pair according to the fifth embodiment.

FIG. 19 is a characteristic diagram of a differential transmission line pair according to the fifth embodiment. Specifically, it shows a differential-mode transmission characteristic (Sdd21) in the differential transmission line pair 512, differential-mode reflecting characteristics (Sdd11, Sdd22), and frequency dependency of the common-mode transmission characteristic (Scc21).

The differential transmission line pair 512 has a shape of being right and left asymmetric, whereby differential-mode and common-mode conversion characteristics (Scd21, Sdc21) increase (deteriorate), but the common-mode transmission characteristic (Scc21) shows an effect that the propagation of the common-mode signal component with a frequency of 25 GHz can be impeded by about 20 dB.

Sixth Embodiment

Figure 20:
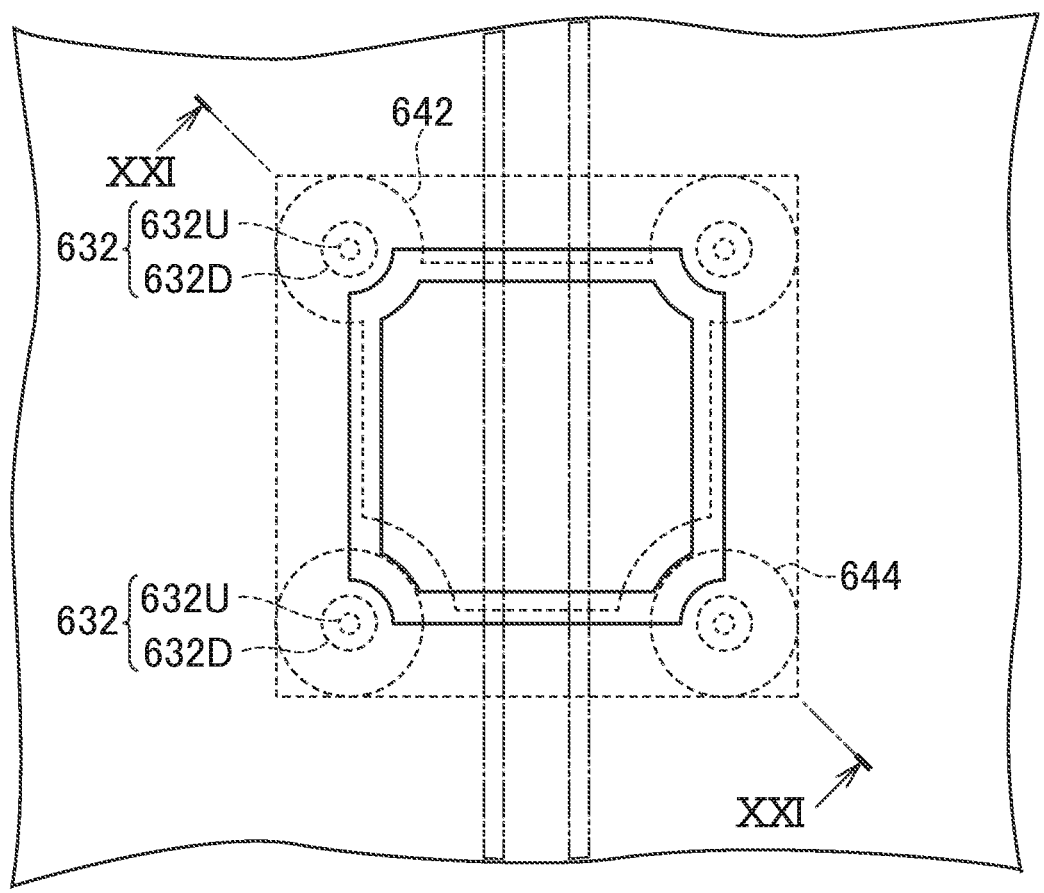
FIG. 20 is a partial plan view of a printed circuit board according to a sixth embodiment.
Figure 21:
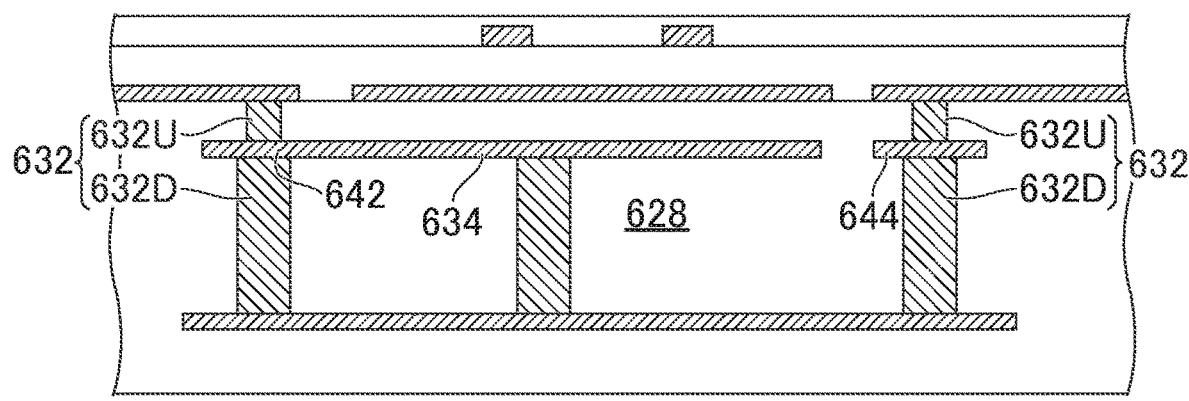
FIG. 21 is a XXI-XXI cross-sectional view of the printed circuit board in FIG. 20.

FIG. 20 is a partial plan view of a printed circuit board according to a sixth embodiment. FIG. 21 is a XXI-XXI cross-sectional view of the printed circuit board in FIG. 20.

Each via 632 is composed of the lower via 632D and the upper via 632U overlapping with each other and having different diameters. The lower via 632D is a drill via. The lower via 632D is formed by drilling a cylindrical hole perpendicular to the inner dielectric layer 628 and copper-plating a side of the hole. The diameter is, for example, 0.2 mm. Above and below the cylindrical hole, an isolated land 644 and a land portion 642 of the electromagnetic resonance plate 634 are formed to have a diameter of 0.45 mm. The upper via 632U is a laser via.

Main dimensions may be selected depending on thickness of each applied layer to make the attenuation area in the common-mode transmission characteristic (Scc21) be a desired frequency. A three-dimensional electromagnetic field analysis tool should be used to calculate the dimensions. For example, the center-to-center distance of the upper via 632U and the lower via 632D is 1.4 mm in a vertical direction and 1.2 mm in a horizontal direction. Other dimensions are based on the first embodiment. According to the present embodiment, a relatively expensive build-up process required for forming the laser via can be reduced by at least one layer, and cost reduction is possible.

Seventh Embodiment

Figure 22:
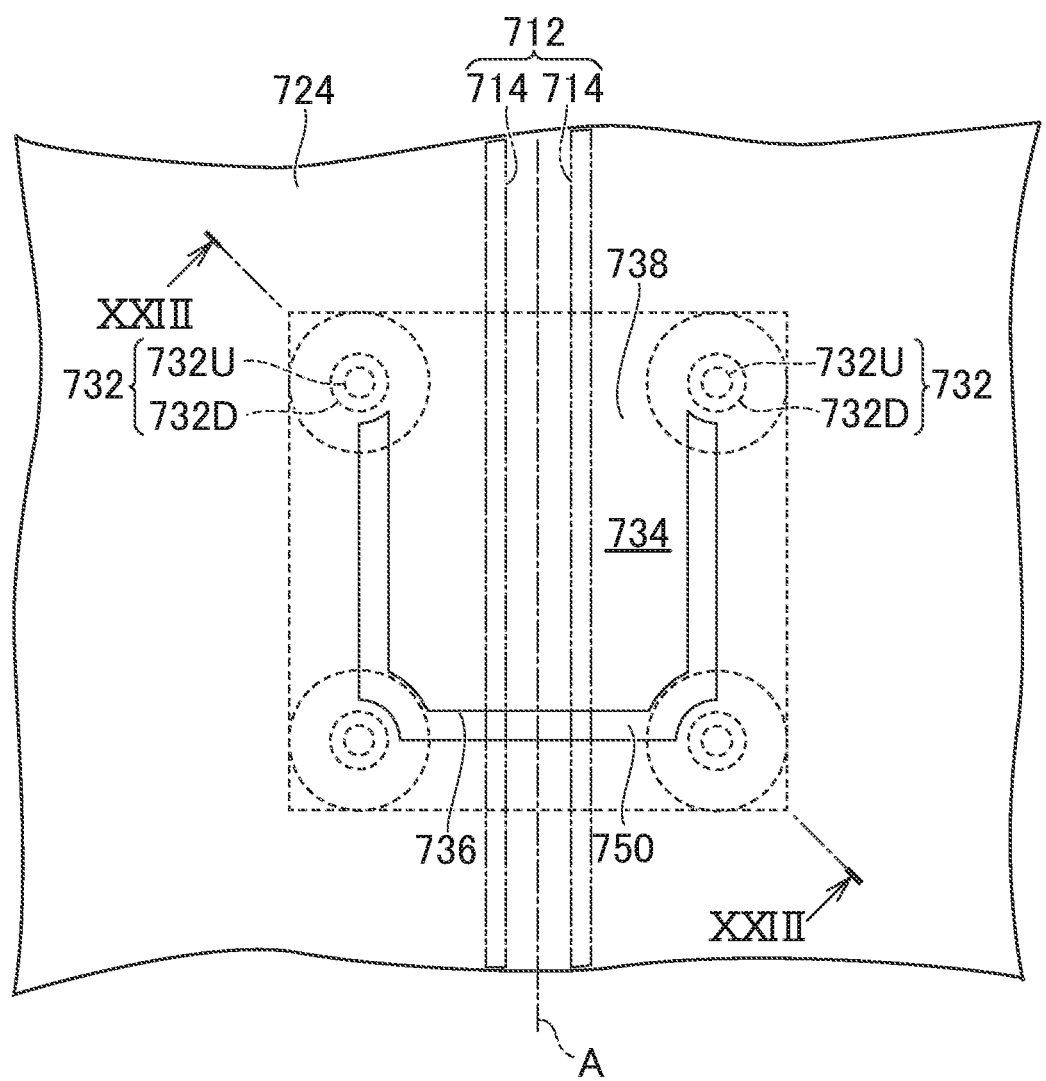
FIG. 22 is a partial plan view of a printed circuit board according to a seventh embodiment.
Figure 23:
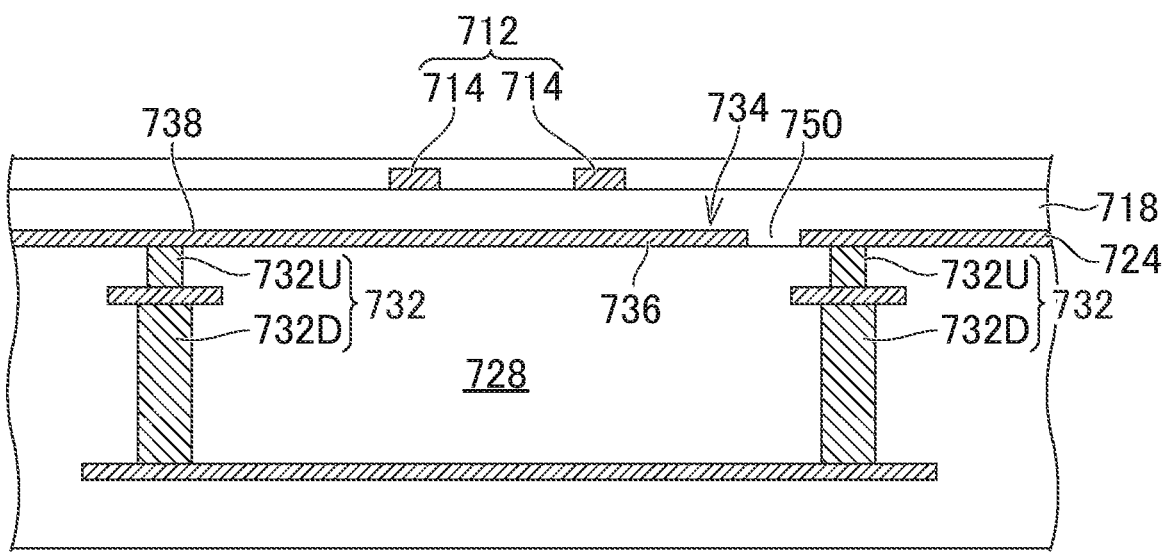
FIG. 23 is a XXIII-XXIII cross-sectional view of the printed circuit board in FIG. 22.

FIG. 22 is a partial plan view of a printed circuit board according to a seventh embodiment. FIG. 23 is a XXIII-XXIII cross-sectional view of the printed circuit board in FIG. 22.

Each via 732 is composed of a lower via 732D and an upper via 732U overlapping with each other and having different diameters. The details are as described in the sixth embodiment. Both the electromagnetic resonance plate 734 and the ground conductor 724 are interposed between the inner dielectric layer 728 and the upper dielectric layer 718.

Figure 24:
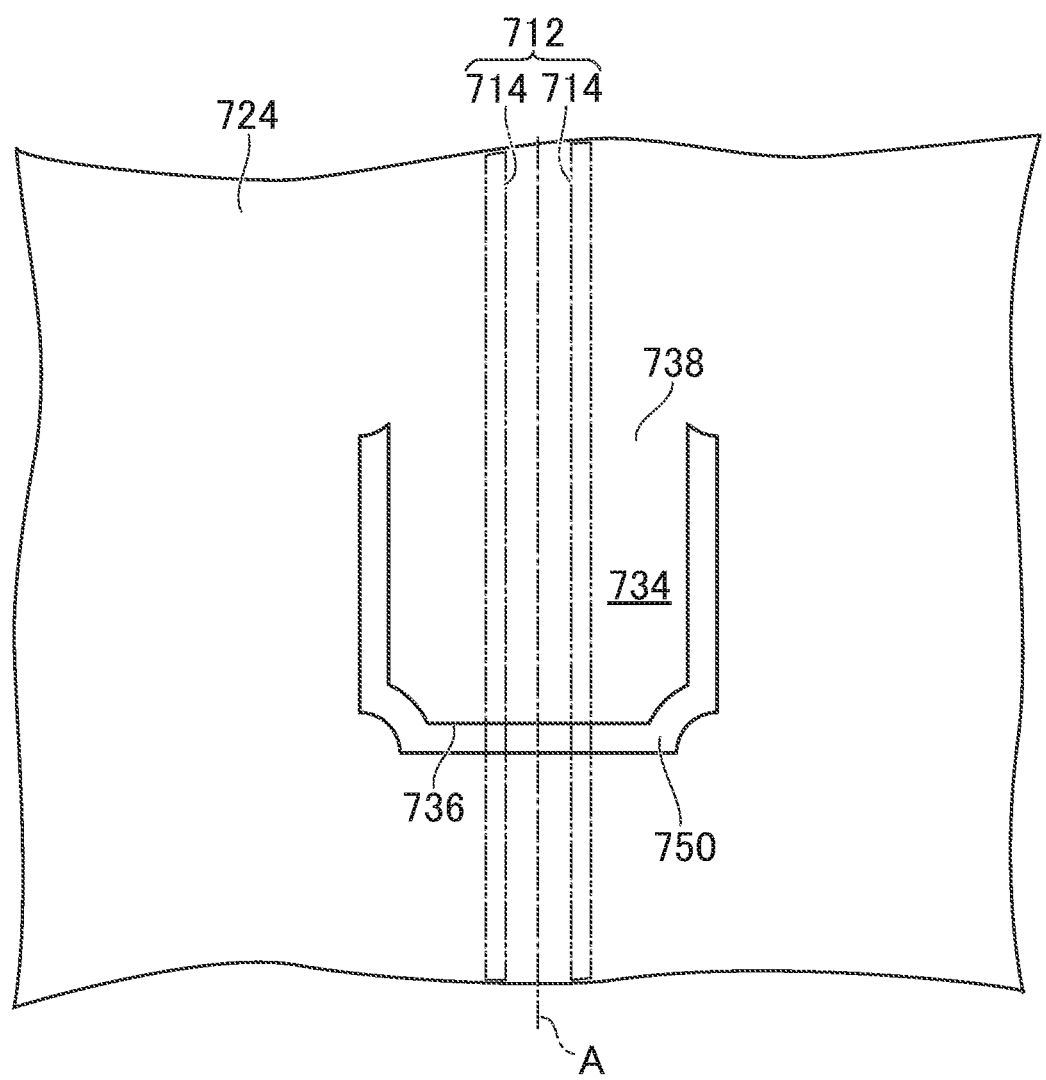
FIG. 24 is a plan view of a ground conductor and an electromagnetic resonance plate.

FIG. 24 is a plan view of a ground conductor and an electromagnetic resonance plate. The electromagnetic resonance plate 734 and the ground conductor 724 are partially integrated and partially separated by a slit 750. The slit 750 is along the protruding outer edge 736 of the electromagnetic resonance plate 734 and may have a U shape. A pair of upper vias 732U are adjacent to both ends of the slit 750 (FIG. 22). A portion (junction 738) excluding the protruding outer edge 736 of the electromagnetic resonance plate 734 is integrated with the ground conductor 724.

Figure 25:
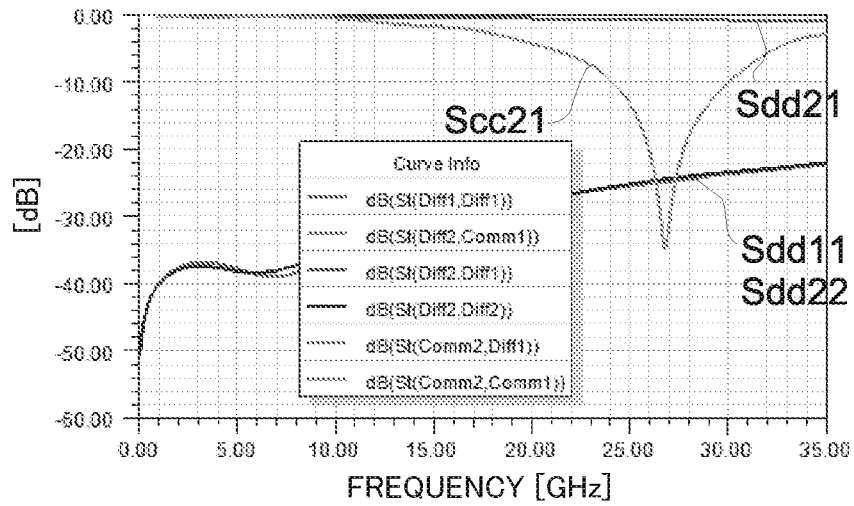
FIG. 25 is a characteristic diagram of a differential transmission line pair according to the seventh embodiment.

FIG. 25 is a characteristic diagram of a differential transmission line pair according to the seventh embodiment. Specifically, it shows a differential-mode transmission characteristic in the differential transmission line pair 712 (Sdd21), differential-mode reflecting characteristics (Sdd11, Sdd22), and frequency dependency of the common-mode transmission characteristic (Scc21).

There is little degradation of the differential-mode reflecting characteristics (Sdd11, Sdd22) and a very good value at less than −20 dB is kept in a frequency range of 0-35 GHz. This is an effect obtained by the electromagnetic resonance plate 734 having the shape of a line symmetry with respect to the symmetry axis A of the pair of strip conductors 714. The differential-mode transmission characteristic (Sdd21) also shows a good characteristic. The common-mode transmission characteristic (Scc21) creates a attenuation area centered at the frequency of 26.8 GHz, impeding the propagation of the common-mode signal component with the frequency of 26.56 GHz by 30 dB or more. The frequency of 26.56 GHz corresponds to, for example, the modulation rate 26.56 Gbaud in a 400-Gbit/s-class optical transceiver 102.

Furthermore, the frequency range where the propagation of the common-mode signal component can be impeded by 10 dB or more has a width of 5.9 GHz from 24.1 GHz to 30 GHz, achieving an attenuation effect over a wide band. This attenuation characteristic is the effect of the electromagnetic field confinement structure and the resonance by the electromagnetic resonance plate 734.

The present embodiment can selectively impede only the propagation of the common-mode signal component to the differential transmission line pair 712 without degrading the propagation of the differential signal component. Further, no additional step is required for manufacturing the printed circuit board, being advantageously accompanied by no increase of cost.

The present embodiment can obtain a better common-mode impeding characteristic than the first embodiment. The relatively expensive build-up process required for the formation of laser vias can also be reduced by at least one layer, whereby a printed circuit board at a lower cost can be provided.

[Outline of the Embodiments]

(1) A printed circuit board 10 including: an inner dielectric layer 28; a conductor plate 30 below the inner dielectric layer 28; some vias 32 through the inner dielectric layer 28, the vias 32 being bonded to the conductor plate 30, the vias 32 being centered at respective points P on an upper surface of the conductor plate 30; a ground conductor 24 above the inner dielectric layer 28, the ground conductor 24 being bonded to the vias 32, the ground conductor 24 extending outwardly from any quadrangle Q with vertices being the nearest four points P of the points P; an electromagnetic resonance plate 34 above the inner dielectric layer 28 and inside the quadrangle Q, the electromagnetic resonance plate 34 being electrically connected to the ground conductor 24 and the vias 32 with a portion other than a protruding outer edge 36 serving as a junction 38; an upper dielectric layer 18 above the electromagnetic resonance plate 34; and a differential transmission line pair 12 composed of a pair of strip conductors 14 overlapping with the electromagnetic resonance plate 34, above the upper dielectric layer 18, the conductor plate 30 and the vias 32 constituting an electromagnetic field confinement structure, the electromagnetic resonance plate 34 being capable of resonating with an unwanted electromagnetic wave propagating through the differential transmission line pair 12.

(2) The printed circuit board 10 according to (1), wherein the conductor plate 30 overlaps with the entire electromagnetic resonance plate 34.

(3) The printed circuit board 10 according to (1) or (2), wherein the protruding outer edge 36 of the electromagnetic resonance plate 34 does not overlap with the ground conductor 24.

(4) The printed circuit board 10 according to any one of (1) to (3), wherein the vias 32 include a right pair of vias 32R and a left pair of vias 32L centered at the respective four points P, and the right pair of vias 32R and the left pair of vias 32L have a line symmetric positional relationship.

(5) The printed circuit board 10 according to any one of (1) to (4), wherein the pair of strip conductors 14 have a line symmetric positional relationship, and the electromagnetic resonance plate 34 has a line symmetric shape with respect to a symmetric axis A of the pair of strip conductors 14.

(6) The printed circuit board 10 according to any one of (1) to (5), wherein the upper dielectric layer 18 includes an upper layer 20 and a lower layer 22, the ground conductor 24 is interposed between the upper layer 20 and the lower layer 22, each of the vias 32 further penetrates the lower layer 22 and is bonded to the ground conductor 24, the electromagnetic resonance plate 34 is interposed between the lower layer 22 and the inner dielectric layer 28, and the vias 32 include a first pair of vias 32A bonded to the electromagnetic resonance plate 34 and a second pair of vias 32B not bonded to the electromagnetic resonance plate 34.

(7) The printed circuit board 10 according to (6), wherein the ground conductor 24 has an opening 26, the printed circuit board 10 further including a floating conductor 48 between the upper layer 20 and the lower layer 22, inside the opening 26, in no contact with the ground conductor 24, and capable of resonating with the unwanted electromagnetic wave.

(8) The printed circuit board 10 according to (7), wherein the electromagnetic resonance plate 34 overlaps with the entire floating conductor 48.

(9) The printed circuit board according to (7) or (8), wherein the points P are vertices of some quadrangles Q.

(10) The printed circuit board according to (9), wherein the opening 26 includes some openings 26 overlapping with the respective quadrangles Q, and the floating conductor 48 includes some floating conductors 48 inside the respective quadrangles Q.

(11) The printed circuit board according to (9), wherein the opening 326 is one opening 326 continuously overlapping with the quadrangles Q, and the floating conductor 348 includes some floating conductors 348 inside the respective quadrangles Q.

(12) The printed circuit board according to (9), wherein the opening 426 is one opening 426 continuously overlapping with the quadrangles Q, and the floating conductor 448 is one floating conductor 448 continuously inside the quadrangles Q.

(13) The printed circuit board according to (9) or (10), wherein the electromagnetic resonance plate 34 includes some electromagnetic resonance plates 34, the differential transmission line pair 12 includes some differential transmission line pairs 12, and each of the differential transmission line pairs 12 overlaps with a corresponding one of the electromagnetic resonance plates 34.

(14) The printed circuit board according to (13), wherein the conductor plate 30 includes some conductor plates 30 overlapping with the respective electromagnetic resonance plates 34.

(15) The printed circuit board according to (13), wherein adjacent ones of the quadrangles Q share one of the four points P serving as the vertices, and the electromagnetic resonance plates 234 are inside the respective quadrangles Q.

(16) The printed circuit board according to (15), wherein the quadrangles Q are arranged in a staggered pattern.

(17) The printed circuit board according to any one of (9), (11), and (12), wherein adjacent ones of the quadrangles Q share a pair of points PX of the four points P serving as the vertices, and the vias 332 include a pair of vias 332 centered at the pair of points PX.

(18) The printed circuit board according to (17), wherein the electromagnetic resonance plate 334 includes some electromagnetic resonance plates 334 overlapping with the respective quadrangles Q, and the differential transmission line pair 312 overlaps with the electromagnetic resonance plates 334.

(19) The printed circuit board according to (17), wherein the electromagnetic resonance plate 434 is bonded to the pair of vias 432, and the protruding outer edge 436 protrudes in opposite directions from the pair of vias 432.

(20) The printed circuit board according to any one of (17) to (19), wherein the differential transmission line pair 312 is between the pair of vias 332.

(21) The printed circuit board according to any one of (1) to (5), wherein the electromagnetic resonance plate 734 and the ground conductor 724 are interposed between the inner dielectric layer 728 and the upper dielectric layer 718, partially integrated, and partially separated by a slit 750.

(22) The printed circuit board according to any one of (1) to (21), wherein each of the vias 632 is composed of a lower via 632D and an upper via 632U having different diameters and overlapping with each other.

(23) The printed circuit board 10 according to any one of (1) to (22), wherein a space between the points P is less than ½ of a wavelength of the unwanted electromagnetic wave with which the electromagnetic resonance plate 34 is capable of resonating.

(24) An optical transceiver 102 including: the printed circuit board 10 according to any one of (1) to (23); and an optical subassembly 116 electrically connected to the printed circuit board 10.

The embodiments described above are not limited and different variations are possible. The structures explained in the embodiments may be replaced with substantially the same structures and other structures that can achieve the same effect or the same objective.

What is claimed is:

1. A printed circuit board comprising:
an inner dielectric layer;
a conductor plate below the inner dielectric layer;
some vias through the inner dielectric layer, the vias being bonded to the conductor plate, the vias being centered at respective points on an upper surface of the conductor plate;
a ground conductor above the inner dielectric layer, the ground conductor being bonded to the vias, the ground conductor extending outwardly from any quadrangle with vertices being the nearest four points of the points;
an electromagnetic resonance plate above the inner dielectric layer and inside the quadrangle, the electromagnetic resonance plate being electrically connected to the ground conductor and the vias with a portion other than a protruding outer edge serving as a junction;
an upper dielectric layer above the electromagnetic resonance plate; and
a differential transmission line pair composed of a pair of strip conductors overlapping with the electromagnetic resonance plate, above the upper dielectric layer,
the conductor plate and the vias constituting an electromagnetic field confinement structure,
the electromagnetic resonance plate being capable of resonating with an unwanted electromagnetic wave propagating through the differential transmission line pair.

2. The printed circuit board according to claim 1, wherein the conductor plate overlaps with the entire electromagnetic resonance plate.

3. The printed circuit board according to claim 1, wherein the protruding outer edge of the electromagnetic resonance plate does not overlap with the ground conductor.

4. The printed circuit board according to claim 1, wherein
the vias include a right pair of vias and a left pair of vias centered at the respective four points, and
the right pair of vias and the left pair of vias have a line symmetric positional relationship.

5. The printed circuit board according to claim 1, wherein
the pair of strip conductors have a line symmetric positional relationship, and
the electromagnetic resonance plate has a line symmetric shape with respect to a symmetric axis of the pair of strip conductors.

6. The printed circuit board according to claim 1, wherein
the upper dielectric layer includes an upper layer and a lower layer,
the ground conductor is interposed between the upper layer and the lower layer,
each of the vias further penetrates the lower layer and is bonded to the ground conductor,
the electromagnetic resonance plate is interposed between the lower layer and the inner dielectric layer, and
the vias include a first pair of vias bonded to the electromagnetic resonance plate and a second pair of vias not bonded to the electromagnetic resonance plate.

7. The printed circuit board according to claim 6, wherein the ground conductor has an opening,
the printed circuit board further comprising a floating conductor between the upper layer and the lower layer, inside the opening, in no contact with the ground conductor, and capable of resonating with the unwanted electromagnetic wave.

8. The printed circuit board according to claim 7, wherein the electromagnetic resonance plate overlaps with the entire floating conductor.

9. The printed circuit board according to claim 7, wherein the points are vertices of some quadrangles.

10. The printed circuit board according to claim 9, wherein
the opening includes some openings overlapping with the respective quadrangles, and
the floating conductor includes some floating conductors inside the respective quadrangles.

11. The printed circuit board according to claim 9, wherein
the opening is one opening continuously overlapping with the quadrangles, and
the floating conductor includes some floating conductors inside the respective quadrangles.

12. The printed circuit board according to claim 9, wherein
the opening is one opening continuously overlapping with the quadrangles, and
the floating conductor is one floating conductor continuously inside the quadrangles.

13. The printed circuit board according to claim 9, wherein
the electromagnetic resonance plate includes some electromagnetic resonance plates,
the differential transmission line pair includes some differential transmission line pairs, and
each of the differential transmission line pairs overlaps with a corresponding one of the electromagnetic resonance plates.

14. The printed circuit board according to claim 13, wherein the conductor plate includes some conductor plates overlapping with the respective electromagnetic resonance plates.

15. The printed circuit board according to claim 13, wherein
adjacent ones of the quadrangles share one of the four points serving as the vertices, and
the electromagnetic resonance plates are inside the respective quadrangles.

16. The printed circuit board according to claim 15, wherein the quadrangles are arranged in a staggered pattern.

17. The printed circuit board according to claim 9, wherein
adjacent ones of the quadrangles share a pair of points of the four points serving as the vertices, and
the vias include a pair of vias centered at the pair of points.

18. The printed circuit board according to claim 17, wherein
the electromagnetic resonance plate includes some electromagnetic resonance plates overlapping with the respective quadrangles, and
the differential transmission line pair overlaps with the electromagnetic resonance plates.

19. The printed circuit board according to claim 17, wherein
the electromagnetic resonance plate is bonded to the pair of vias, and
the protruding outer edge protrudes in opposite directions from the pair of vias.

20. The printed circuit board according to claim 17, wherein the differential transmission line pair is between the pair of vias.

21. The printed circuit board according to claim 1, wherein the electromagnetic resonance plate and the ground conductor are interposed between the inner dielectric layer and the upper dielectric layer, partially integrated, and partially separated by a slit.

22. The printed circuit board according to claim 1, wherein each of the vias is composed of a lower via and an upper via having different diameters and overlapping with each other.

23. The printed circuit board according to claim 1, wherein a space between the points is less than ½ of a wavelength of the unwanted electromagnetic wave with which the electromagnetic resonance plate is capable of resonating.

24. An optical transceiver comprising:
the printed circuit board according to claim 1; and
an optical subassembly electrically connected to the printed circuit board.

* * * * *